US008256370B2

(12) United States Patent
Kitano et al.

(10) Patent No.: US 8,256,370 B2
(45) Date of Patent: Sep. 4, 2012

(54) COATING APPARATUS AND METHOD

(75) Inventors: Takahiro Kitano, Koshi (JP); Koichi Obata, Koshi (JP); Hiroichi Inada, Koshi (JP); Nobuhiro Ogata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 682 days.

(21) Appl. No.: 12/390,752

(22) Filed: Feb. 23, 2009

(65) Prior Publication Data
US 2009/0285991 A1  Nov. 19, 2009

(30) Foreign Application Priority Data
May 14, 2008  (JP) ................................. 2008-127355

(51) Int. Cl.
B05C 11/02 (2006.01)
B05C 13/00 (2006.01)
B05C 13/02 (2006.01)
B05C 5/00 (2006.01)
B05C 21/00 (2006.01)
B05B 13/04 (2006.01)
B65G 53/16 (2006.01)
B65G 53/00 (2006.01)
B65G 53/26 (2006.01)
B65G 69/06 (2006.01)

(52) U.S. Cl. ............ 118/52; 118/56; 118/320; 118/500; 406/86; 406/88; 396/604; 396/611; 396/627; 414/676; 134/153; 134/157; 134/182; 134/902

(58) Field of Classification Search ........................ None
See application file for complete search history.

(56) References Cited

U.S. PATENT DOCUMENTS
5,159,374 A * 10/1992 Groshong ...................... 396/609
5,689,749 A * 11/1997 Tanaka et al. ................. 396/611
6,332,723 B1 * 12/2001 Matsuyama et al. .......... 396/571
6,781,684 B1 * 8/2004 Ekhoff ....................... 356/237.1
7,396,022 B1 * 7/2008 Moghadam et al. .......... 118/500
7,604,439 B2 * 10/2009 Yassour et al. .................. 406/88
7,908,995 B2 * 3/2011 Inamasu et al. ............... 118/300
8,057,601 B2 * 11/2011 Koelmel et al. ............... 118/730
2006/0086460 A1 * 4/2006 Kitamura et al. .............. 118/719
2008/0280054 A1 * 11/2008 Ogata et al. ................... 118/320

FOREIGN PATENT DOCUMENTS
| JP | 62-62869 | 4/1987 |
| JP | 2-16447 | 1/1990 |
| JP | 6-20935 | 1/1994 |
| JP | 2006-237063 | 9/2006 |

* cited by examiner

Primary Examiner — Dah-Wei Yuan
Assistant Examiner — Binu Thomas
(74) Attorney, Agent, or Firm — Oblon, Spivak, McClelland, Maier & Neustadt, L.L.P.

(57) ABSTRACT

A coating apparatus includes a liquid film forming mechanism configured to form a liquid film of a process liquid for preventing a contaminant derived from a coating liquid from being deposited or left on a back side peripheral portion of a substrate. The liquid film forming mechanism includes a counter face portion facing the back side peripheral portion of the substrate and a process liquid supply portion for supplying the process liquid onto the counter face portion. The coating apparatus further includes a posture regulating mechanism disposed around the substrate holding member and configured to damp a vertical wobble of the peripheral portion of the substrate being rotated. The posture regulating mechanism includes delivery holes arrayed in a rotational direction of the substrate and configured to deliver a gas onto a back side region of the substrate on an inner side of the peripheral portion.

19 Claims, 24 Drawing Sheets

COATING APPARATUS AND METHOD

BACKGROUND OF THE INVENTION

1. Field of the Invention

The present invention relates to a coating apparatus and method for applying a chemical liquid, such as a resist, onto a substrate, such as a semiconductor wafer. The present invention also relates to a coating/developing apparatus including the coating apparatus and a storage medium that stores a program for executing the coating method.

2. Description of the Related Art

In the process of manufacturing semiconductor devices, there is a step of applying a coating liquid onto a substrate by a spin coating method. The coating liquid may be exemplified by a resist, a chemical liquid for forming an anti-reflection film, and a chemical liquid containing a precursor of silicon oxide for forming an insulating film. The spin coating method is arranged to use a spin chuck to attract and hold the back side central portion of a substrate, such as a semiconductor wafer (which may be simply referred to as "wafer") or a LCD glass substrate. The coating liquid is supplied on the front side central portion of the substrate, and the spin chuck is rotated about a vertical axis, so that the coating liquid is spread toward the peripheral portion of the substrate or wafer by a centrifugal force.

Incidentally, due to aggravation of environmental issues, it is required to reduce consumption of organic solvents and emission thereof into the atmosphere. Under the circumstances, for example, in resist coating apparatuses for performing a spin coating method as described above, a resist-saving coating method may be used to reduce resist consumption, such that an organic solvent is first supplied onto a wafer to improve the compatibility of the wafer with a resist, and then the resist is supplied onto the wafer. According to this resist-saving coating method, consumption of an organic solvent contained in the resist becomes smaller due to a decrease in resist consumption, whereby the total amount of the organic solvent used for forming a film per wafer is reduced.

However, where a resist film R is formed by spin coating as described above, a resist supplied onto the wafer W is scattered as mist M, and the scattered mist M may be deposited on the back side peripheral portion of the wafer W, as shown in FIG. 24A. In order to prevent this mist M from becoming particles and thereby hindering the normal resist pattern formation, there is adopted a step of supplying a solvent, such as a thinner, onto the back side of the wafer W from a back side cleaning nozzle 11 to wash out the mist M, as shown in FIG. 24B.

This back side cleaning step using the back side cleaning nozzle 11 may consume the largest amount of solvent among steps performed in a coating/developing apparatus including a resist coating apparatus, such as 20 cc of solvent per wafer. Where coating and developing processes are performed on 600 wafers per month in the coating/developing apparatus and the solvent is consumed by 20 cc per wafer for the purpose described above, the total amount of consumption of the solvent reaches 120 tons per month in the resist coating apparatus. The explanation described above concerns a resist coating apparatus, but back side cleaning may be performed, as in resist film formation modules, in other various apparatuses for applying a chemical liquid onto a substrate to form a film of the chemical liquid. Accordingly, consumption of organic solvents for such back side cleaning is a problematic issue.

In order to prevent a liquid from being scattered, spin coating is performed in a cup with a suction passage connected thereto at a lower side, and the interior of the cup is exhausted by suction through the suction passage to form exhaust flows inside the cup. In this respect, studies have been made to alter the structure of the cup to control the exhaust flows, so that deposition of mist M on the wafer W is decreased. However, in this case, deposition of mist cannot be completely prevented, and so the solvent consumption for back side cleaning is still not so small. Rather than this method, there is a case where a larger amount of solvent than before is used to wash out mist to reliably prevent particle contamination. Jpn. Pat. Appln. KOKAI Publication No. 2-16447 (FIG. 1) discloses a coating apparatus arranged to perform resist coating on a wafer in a floating state, but this apparatus cannot solve the problem described above.

BRIEF SUMMARY OF THE INVENTION

An object of the present invention is to provide a coating apparatus and method that can reduce the solvent consumption for cleaning the back side of a substrate, wherein the coating apparatus is used for supplying a coating liquid onto the substrate to form a coating film. Another object of the present invention is to provide a coating/developing apparatus including the coating apparatus and a storage medium that stores a program for executing the coating method.

According to a first aspect of the present invention, there is provided a coating apparatus comprising: a substrate holding member configured to hold a back side central portion of a substrate and thereby support the substrate in a horizontal state; a coating nozzle configured to supply a coating liquid onto a front side central portion of the substrate; a rotational driving unit configured to rotate the substrate holding member about a vertical axis, so as to spread the coating liquid supplied on the central portion of the substrate toward a peripheral portion of the substrate by a centrifugal force and thereby form a film of the coating liquid; a liquid film forming mechanism configured to form a liquid film of a process liquid for preventing a contaminant derived from the coating liquid from being deposited or left on a back side peripheral portion of the substrate, the liquid film forming mechanism including a counter face portion facing the back side peripheral portion of the substrate and a process liquid supply portion for supplying the process liquid onto the counter face portion, so that the process liquid is adsorbed by its surface tension on the counter face portion and the peripheral portion of the substrate being rotated and the liquid film is thereby formed; and a posture regulating mechanism disposed around the substrate holding member and configured to damp a vertical wobble of the peripheral portion of the substrate being rotated, the posture regulating mechanism including delivery holes arrayed in a rotational direction of the substrate and configured to deliver a gas onto a back side region of the substrate on an inner side of the peripheral portion on which the liquid film is formed.

The coating apparatus may further comprise a control section configured to control an operation of the coating apparatus, and the control section is preset to perform control; to rotate the substrate at a first rotational speed while supplying the coating liquid onto the substrate; then to stop supply of the coating liquid and rotate the substrate at a second rotational speed lower than the first rotational speed, so as to adjust a planar distribution of the coating liquid on the substrate; and then to rotate the substrate at a third rotational speed higher than the second rotational speed to dry the coating liquid while supplying the process liquid onto the counter face portion of the liquid film forming mechanism.

The posture regulating mechanism may include suction holes arrayed in the rotational direction of the substrate and configured to apply a suction force to a back side region of the substrate on an inner side of the peripheral portion on which the liquid film is formed, so as to damp a vertical wobble of the peripheral portion of the substrate being rotated, in cooperation with the gas delivered from the delivery holes. In this case, the delivery holes and the suction holes may be alternately arrayed in the rotational direction and radial directions of the substrate.

The coating apparatus may further comprise a first elevating mechanism configured to move up and down the posture regulating mechanism between a working position for regulating a wobble of the peripheral portion of the substrate and a waiting position below the working position. In this case, the coating apparatus may further comprise a second elevating mechanism configured to move up and down the liquid film forming mechanism between a liquid film forming position for forming the liquid film and a waiting position below the liquid film forming position, and the second elevating mechanism moves up the liquid film forming mechanism from the waiting position to the liquid film forming position when the gas is delivered from the delivery holes of the posture regulating mechanism, so as for the liquid film forming mechanism not to come into contact with the substrate.

The liquid film forming mechanism may be provided with a drain portion configured to remove unnecessary part of the process liquid for forming the liquid film. The coating apparatus may be arranged such that the substrate holding member and the liquid film forming mechanism are disposed in a process atmosphere space inside a cup to prevent the coating liquid from being scattered, and the rotational driving unit is disposed in a non-process atmosphere space partitioned from the process atmosphere space by a partition member, an exhaust passage is connected to the process atmosphere space, and a gas flow channel is formed in the partition member such that gas inside the non-process atmosphere space is caused to flow into the process atmosphere space by rotation of the substrate holding member. In this case, a flow conductivity adjuster may be disposed to adjust gas flow conductivity through the gas flow channel from the non-process atmosphere space into the process atmosphere space. The flow conductivity adjuster may comprise a shutter configured to open/close the gas flow channel. The liquid film forming mechanism may have a ring shape extending in the rotational direction of the substrate to form the liquid film in a ring shape.

According to a second aspect of the present invention, there is provided a coating method comprising: holding a back side central portion of a substrate by a substrate holding member and thereby supporting the substrate in a horizontal state; supplying a coating liquid onto a front side central portion of the substrate from a coating nozzle; rotating the substrate holding member about a vertical axis by a rotational driving unit at a first rotational speed, so as to spread the coating liquid supplied on the central portion of the substrate toward a peripheral portion of the substrate by a centrifugal force and thereby form a film of the coating liquid; forming a liquid film of a process liquid for preventing a contaminant derived from the coating liquid from being deposited or left on a back side peripheral portion of the substrate by a liquid film forming mechanism including a counter face portion facing the back side peripheral portion of the substrate, while supplying the process liquid onto the counter face portion from a process liquid supply portion of the liquid film forming mechanism, so that the process liquid is adsorbed by its surface tension on the counter face portion and the peripheral portion of the substrate being rotated and the liquid film is thereby formed; and damping a vertical wobble of the peripheral portion of the substrate being rotated, by a posture regulating mechanism disposed around the substrate holding member and including delivery holes arrayed in a rotational direction of the substrate, while delivering a gas from the delivery holes onto a back side region of the substrate on an inner side of the peripheral portion on which the liquid film is formed.

The coating method may further comprise, subsequently to said forming a film of the coating liquid, stopping supply of the coating liquid and rotating the substrate at a second rotational speed lower than the first rotational speed, so as to adjust a planar distribution of the coating liquid on the substrate; and then, rotating the substrate at a third rotational speed higher than the second rotational speed to dry the coating liquid while supplying the process liquid onto the counter face portion of the liquid film forming mechanism. The coating method may further comprise removing the process liquid for forming the liquid film by rotating the substrate. The posture regulating mechanism may include suction holes arrayed in the rotational direction of the substrate, and said damping the wobble comprises applying a suction force by the suction holes to a back side region of the substrate on an inner side of the peripheral portion on which the liquid film is formed, so as to damp a vertical wobble of the peripheral portion of the substrate being rotated, in cooperation with the gas delivered from the delivery holes.

The coating method may further comprise moving up the posture regulating mechanism to a working position for regulating a wobble of the peripheral portion of the substrate from a waiting position below the working position, while delivering the gas from the delivery holes of the posture regulating mechanism. In this case, the coating method may further comprise moving up the posture regulating mechanism while moving up the liquid film forming mechanism to a liquid film forming position for forming the liquid film from a waiting position below the liquid film forming position.

The coating structure may be arranged such that the substrate holding member and the liquid film forming mechanism are disposed in a process atmosphere space inside a cup to prevent the coating liquid from being scattered, and the rotational driving unit is disposed in a non-process atmosphere space partitioned from the process atmosphere space by a partition member, and the coating method may comprise: exhausting gas from the process atmosphere space; causing gas inside the non-process atmosphere space to flow into the process atmosphere space through a gas flow channel formed in the partition member by rotation of the substrate holding member; and adjusting gas flow conductivity through the gas flow channel from the non-process atmosphere space into the process atmosphere space.

According to a third aspect of the present invention, there is provided a coating/developing apparatus including the coating apparatus according to the first aspect, the coating/developing apparatus comprising: a carrier block configured to place therein a carrier that stores substrates; a process block comprising the coating apparatus as a coating section for applying a resist onto a front side of each of the substrates taken out of the carrier, and a developing section configured to perform development on each of the substrates after light-exposure; and an interface block configured to transfer the substrates between the process block and a light-exposure apparatus configured to perform the light-exposure on the substrates with the resist applied thereon.

According to a fourth aspect of the present invention, there is provided a computer readable medium containing program instructions for execution on a processor for performing the coating method according to the second aspect, wherein the program instructions, when executed by the processor, cause a coating apparatus for applying a coating liquid onto a substrate being rotated to perform the coating method according to the second aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described in detail with reference to the accompanying drawings.

Figure 1:
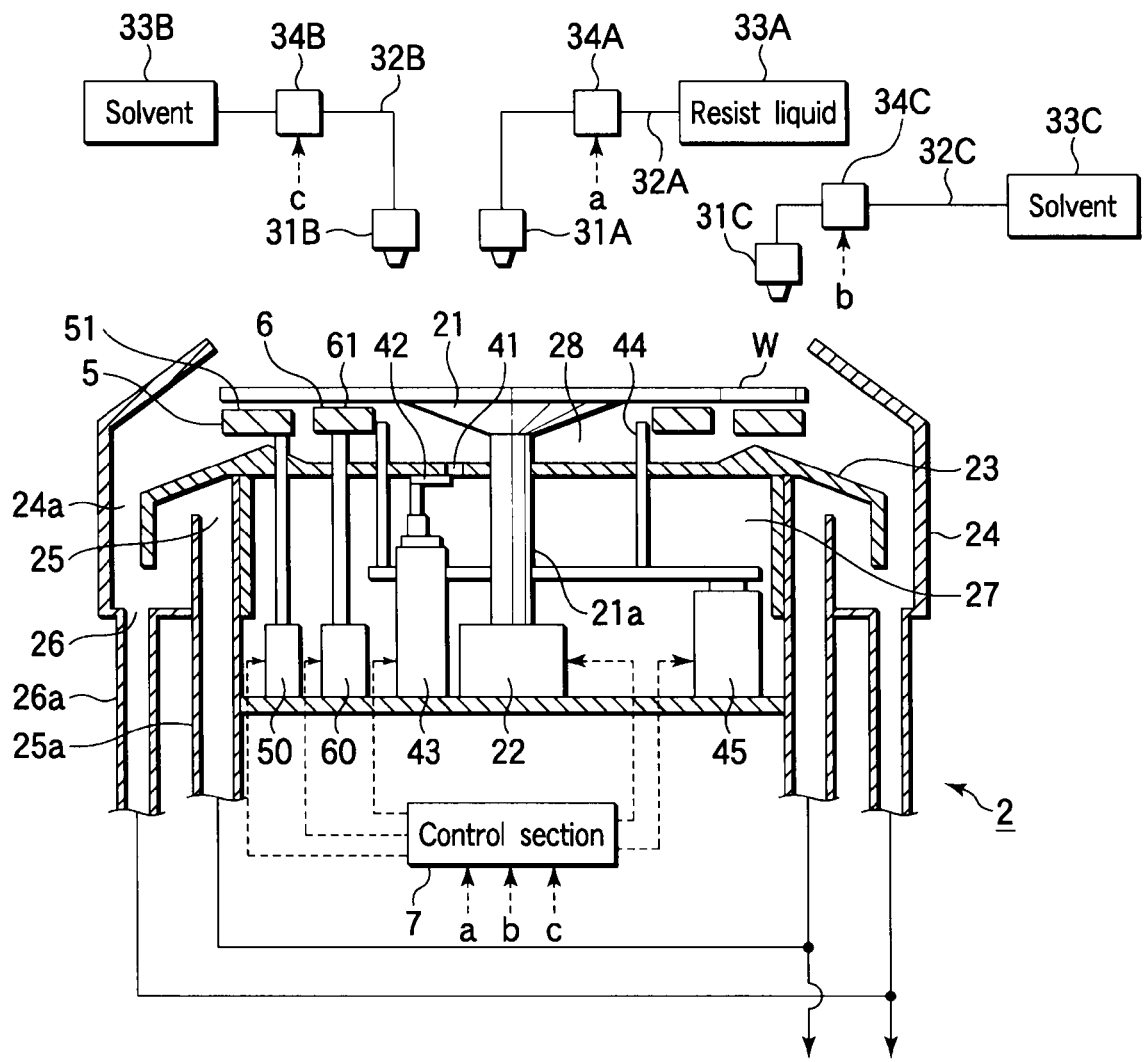
FIG. 1 is a sectional side view showing a coating apparatus according to an embodiment of the present invention.
Figure 2:
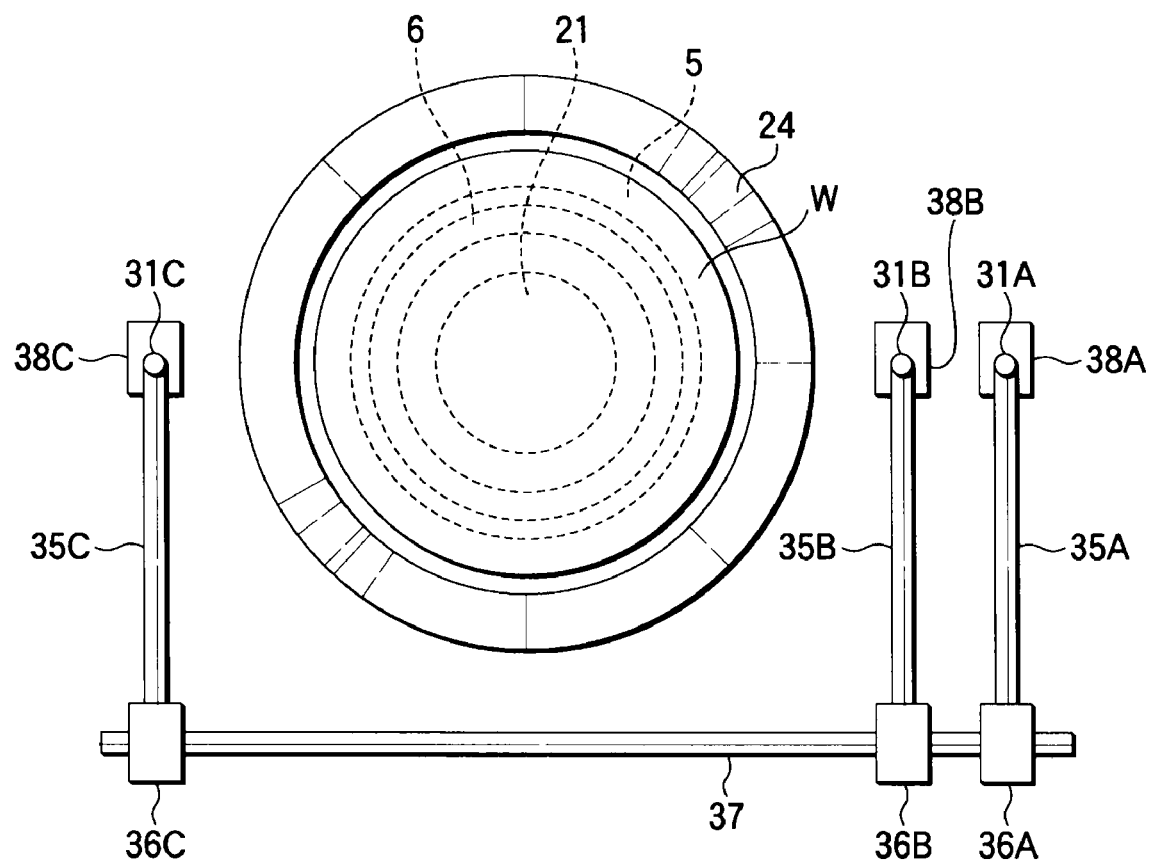
FIG. 2 is a plan view of the coating apparatus.

At first, an explanation will be given of a resist coating apparatus 2, which is a coating apparatus according to an embodiment of the present invention, with reference to FIGS. 1 and 2. FIGS. 1 and 2 are sectional side view and sectional plan view showing the resist coating apparatus 2. As shown in FIG. 1, a spin chuck 21 serving as a substrate holding member is disposed to hold a wafer W in a horizontal state by a vacuum attraction. The spin chuck 21 is rotatable about a vertical axis by a rotational driving unit 22 including a motor or the like through a connecting portion 21a. A partition plate 23 having an essentially circular shape is disposed below the spin chuck 21 to partition the resist coating apparatus 2 into upper and lower sides. The peripheral portion of the partition member or partition plate 23 has a convex shape in the cross section with the outer peripheral portion bent and extended downward. A cup body 24 opened on the upper side is disposed to surround the spin chuck 21 and partition plate 23.

A gap 24a serving as an exhaust passage is defined between the side surface of the cup body 24 and the outer peripheral portion of the partition plate 23.

The lower side of the cup body 24 cooperates with the outer peripheral portion of the partition plate 23 to form a bent passage so as to provide a gas/liquid separator. An exhaust port 25 is formed in an inner area of the bottom of the cup body 24 and is connected to an exhaust line 25a. A drain port 26 is formed in an outer area of the bottom of the cup body 24 and is connected to a drain line 26a.

The resist coating apparatus 2 includes a coating nozzle or resist nozzle 31A for supplying a coating liquid or resist onto the front side central portion of the wafer W, a solvent nozzle 31B for supplying a solvent, such as a thinner, onto the front side central portion of the wafer W, and a solvent nozzle 31C for supplying a solvent onto the front side peripheral portion of the wafer W. The nozzles 31A, 31B, and 31C are respectively connected to a resist supply source 33A that stores a resist, and a solvent supply source 33B and a solvent supply source 33C that store a solvent, such as a thinner, through liquid supply lines 32A, 32B, and 32C. The liquid supply lines 32A, 32B, and 32C are respectively provided with liquid supply hardware sets 34A, 34B, and 34C including valves and mass-flow controls. The liquid supply hardware sets 34A, 34B, and 34C are configured to control supply and stop of liquids from the supply sources 33A, 33B, and 33C to the nozzles 31A, 31B, and 31C, respectively, in accordance with control signals transmitted from the control section 7.

The nozzles 31A, 31B, and 31C are respectively connected to moving mechanisms 36A, 36B, and 36C through arms 35A, 35B, and 35C, so that they can travel along a guide rail 37 from one end to the other end of a wafer W placed on the spin chuck 21. Waiting areas 38A, 38B, and 38C are disposed respectively for the nozzles 31A, 31B, and 31C.

Figure 3A:
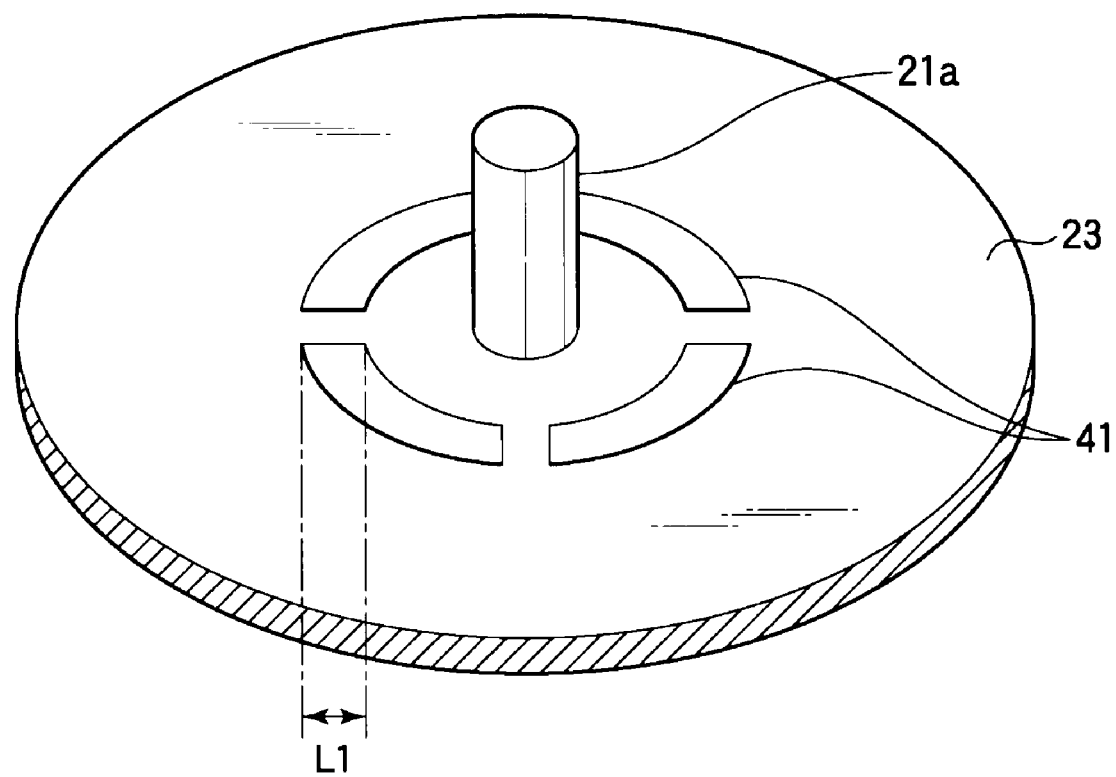
FIGS. 3A and 3B are perspective views showing flow channels and shutters provided in the coating apparatus.
Figure 3B:
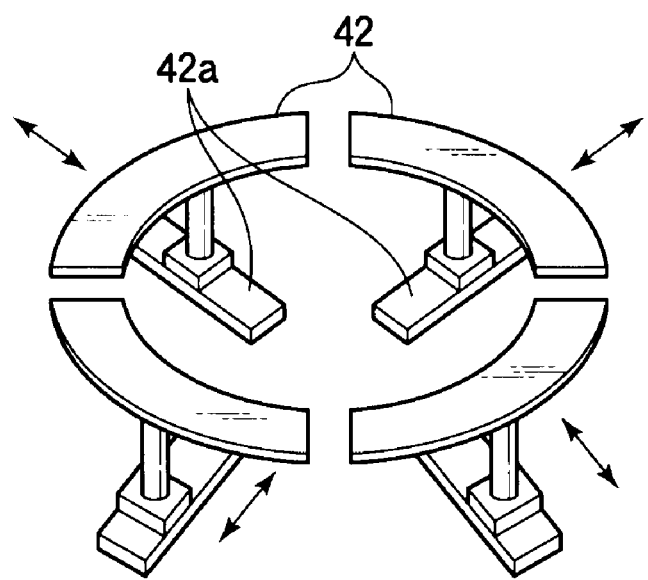

As shown in FIG. 3A, the partition plate 23 has four slits 41 having a width L1 of, e.g., 5 mm and arrayed in a ring pattern that surrounds the connecting portion 21a between the spin chuck 21 and driving unit 22. As shown in FIG. 3B, four shutters 42 are respectively disposed below the slits 41 serving as gas flow channels. Each of the shutters 42 has a fan shape corresponding to the shape of one slit 41 and can be slid by a driving unit 43 along a guide 42a in a radial direction of the fan shape, so that each slit 41 can be opened and closed by the corresponding shutter 42. FIG. 1 merely shows one slit 41 and one shutter 42 for the sake of convenience. Further, each of the slits 41 is provided with a filter (not shown) for removing particles contained in gas passing through this slit 41.

The partition plate 23 partitions the space inside the cup body 24 into an upper space 28 and a lower space 27. In a process atmosphere inside the upper space 28, air flows are formed to flow from the central portion to the peripheral portion of a wafer W due to rotation of the wafer W. Because of a so-called pumping effect, the pressure inside the upper space 28 is lowered, and so gas, such as air, is caused to flow into the upper space 28 through the slits 41 from the lower space 27 that defines a non-process atmosphere.

The partition plate 23 is provided with three support pins 44 (only two of them are shown in FIG. 1) to transfer the wafer W between a transfer mechanism outside the coating apparatus 2 and the spin chuck 21, wherein the support pins 44 are moved up and down by a vertical driving unit 45 disposed in the lower space 27.

Figure 4:
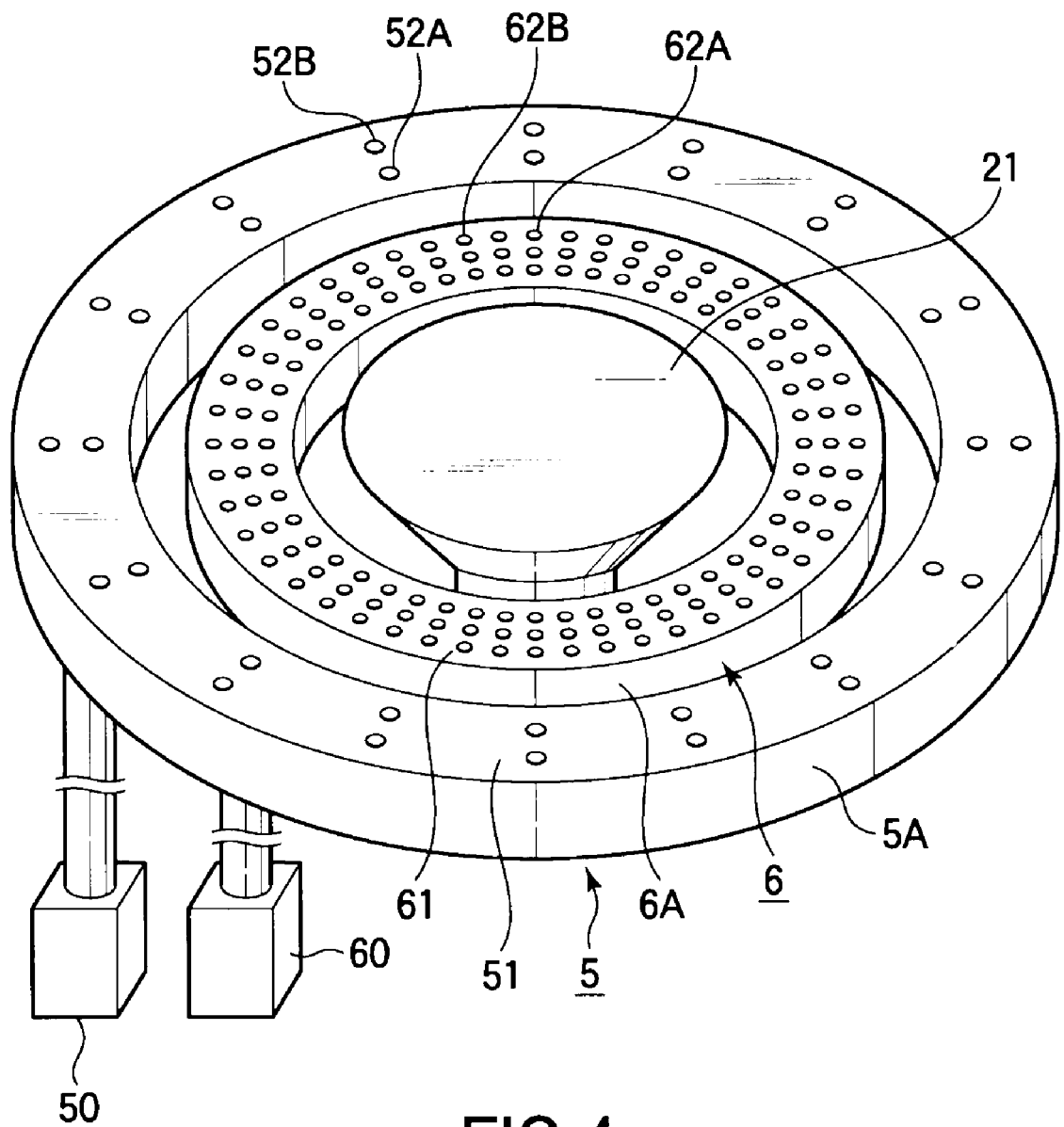
FIG. 4 is a perspective view showing a liquid film forming mechanism and a posture regulating mechanism provided in the coating apparatus.

The coating apparatus 2 includes a posture regulating mechanism 6 and a liquid film forming mechanism 5. As shown in FIG. 4, the posture regulating mechanism 6 includes a flat casing 6A having a ring shape that surrounds the spin chuck 21. The liquid film forming mechanism 5 includes a flat casing 5A having a ring shape that surrounds the casing 6A of the posture regulating mechanism 6. The posture regulating mechanism 6 and liquid film forming mechanism 5 can be respectively moved up and down by vertical driving units 60 and 50 disposed in the lower space 27.

Figure 5A:
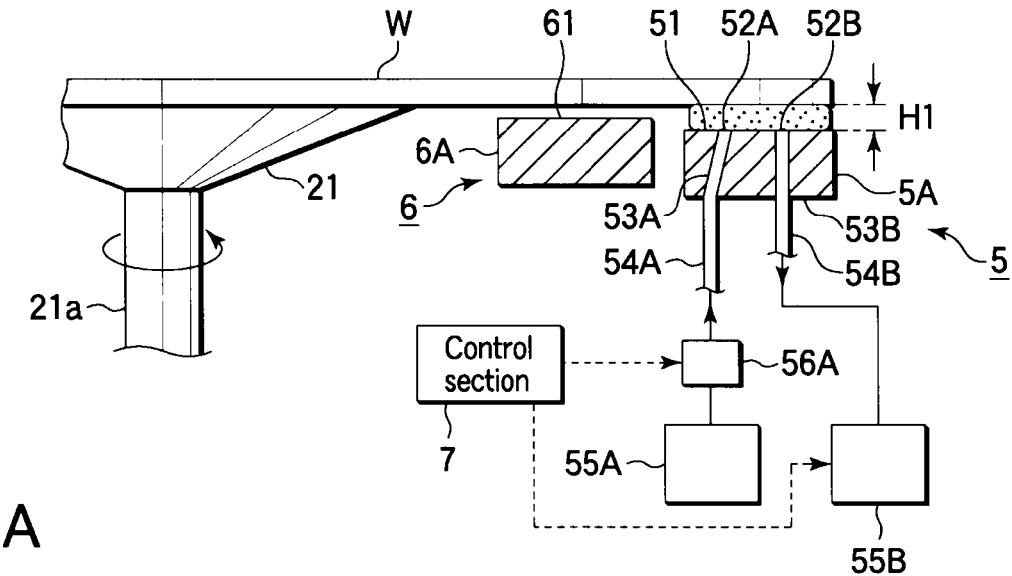
FIGS. 5A to 5C are a structural view and different sectional side views showing the liquid film forming mechanism.

The casing 5A of the liquid film forming mechanism has a counter face portion 51 formed as a horizontal flat surface, which is arranged to extend along the peripheral portion of the wafer W placed on the spin chuck 21 and to face the peripheral portion. The counter face portion 51 has a plurality of solvent supply holes 52A and a plurality of solvent suction holes 52B arrayed in, e.g., annular directions of the casing 5A. As shown in FIG. 5A, the liquid film forming mechanism 5 is movable to a liquid film forming position close to the back side peripheral portion of the wafer W being rotated. At the liquid film forming position, a solvent, such as a thinner, used as a process liquid is supplied from the solvent supply holes 52A of the casing 5A into a gap between the counter face portion 51 of the casing 5A and the back side peripheral portion of the wafer W, so that the thinner thus supplied is adsorbed by its surface tension on the counter face portion 51 and the back side of the wafer W. In other words, the liquid film forming mechanism 5 serves to form a liquid film L all over the peripheral portion of the wafer W by a meniscus method. At the liquid film forming position, the distance H1 between the counter face portion 51 and the back side of the wafer W is set to be within a range of, e.g., 50 μm to 500 μm. Where the wafer W has a diameter of 30 cm, the amount of thinner necessary for forming this liquid film L is set to be within a range of, e.g., 0.5 mL to 50 mL.

Figure 5B:
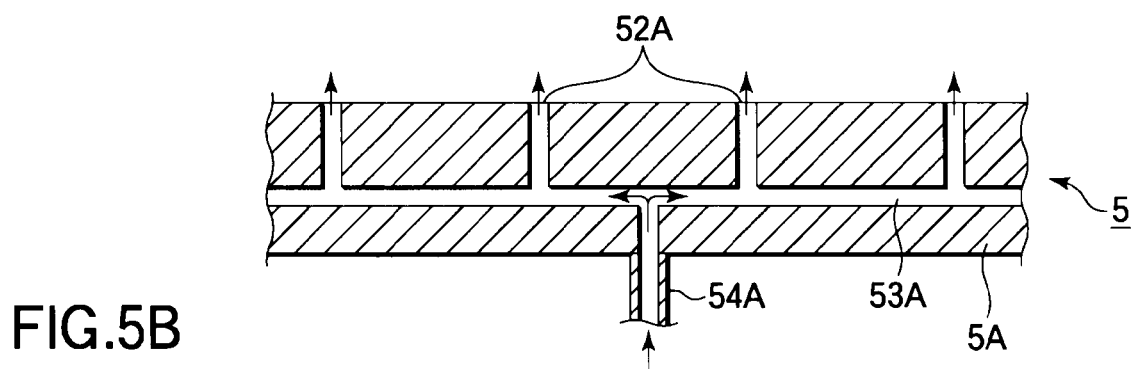
Figure 5C:
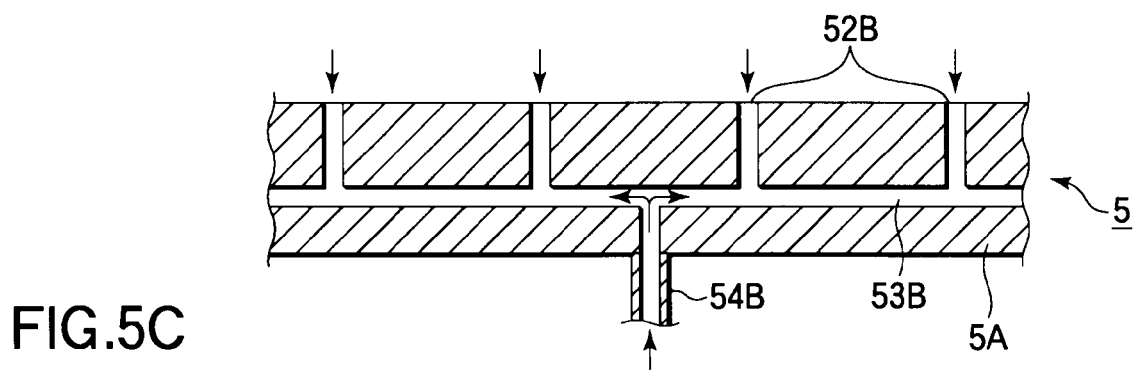

FIGS. 5B and 5C are sectional views of the casing 5A of the liquid film forming mechanism 5, which are taken along different annular directions of the casing 5A. The solvent supply holes 52A are connected to a solvent supply source 55A through a flow channel 53A formed in the casing 5A and a line 54A connected to the flow channel 53A. The line 54A is provided with a flow rate control unit 56A including a valve and a mass-flow control. The flow rate control unit 56A is configured to receive a control signal from the control section 7 and thereby to control the supply and stop of a thinner from the delivery holes 52A. The suction holes 52B are connected to a suction unit 55B, such as an exhaust pump, through a flow channel 53B formed in the liquid film forming mechanism 5 and a line 54B connected to the flow channel 53B. The suction unit 55B includes a pressure regulator (not shown), which is configured to receive a control signal from the control section 7 and thereby to control the suction amount through the suction holes 52B.

Figure 6A:
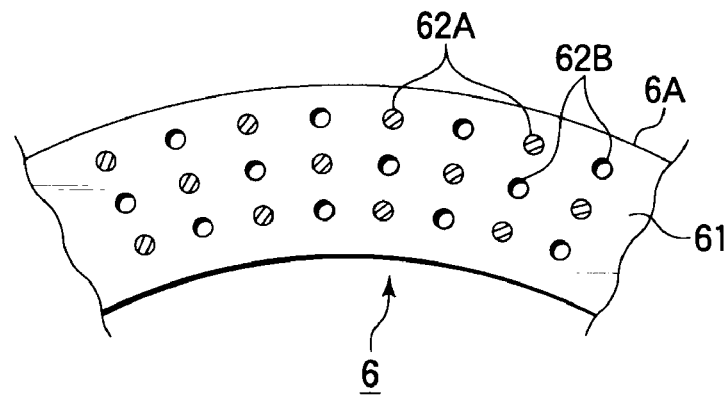
FIGS. 6A and 6B are a plan view and a sectional side view showing the posture regulating mechanism.

The casing 6A of the posture regulating mechanism 6 has a surface 61 formed as a horizontal flat surface, in which gas delivery holes 62A and gas suction holes 62B are formed along annular directions of the posture regulating mechanism 6. FIG. 6A shows the delivery holes 62A with hatching to indicate that the delivery holes 62A and suction holes 62B are alternately arrayed in annular directions and radial directions of the posture regulating mechanism 6, i.e., they are arrayed in a staggered pattern.

Figure 6B:
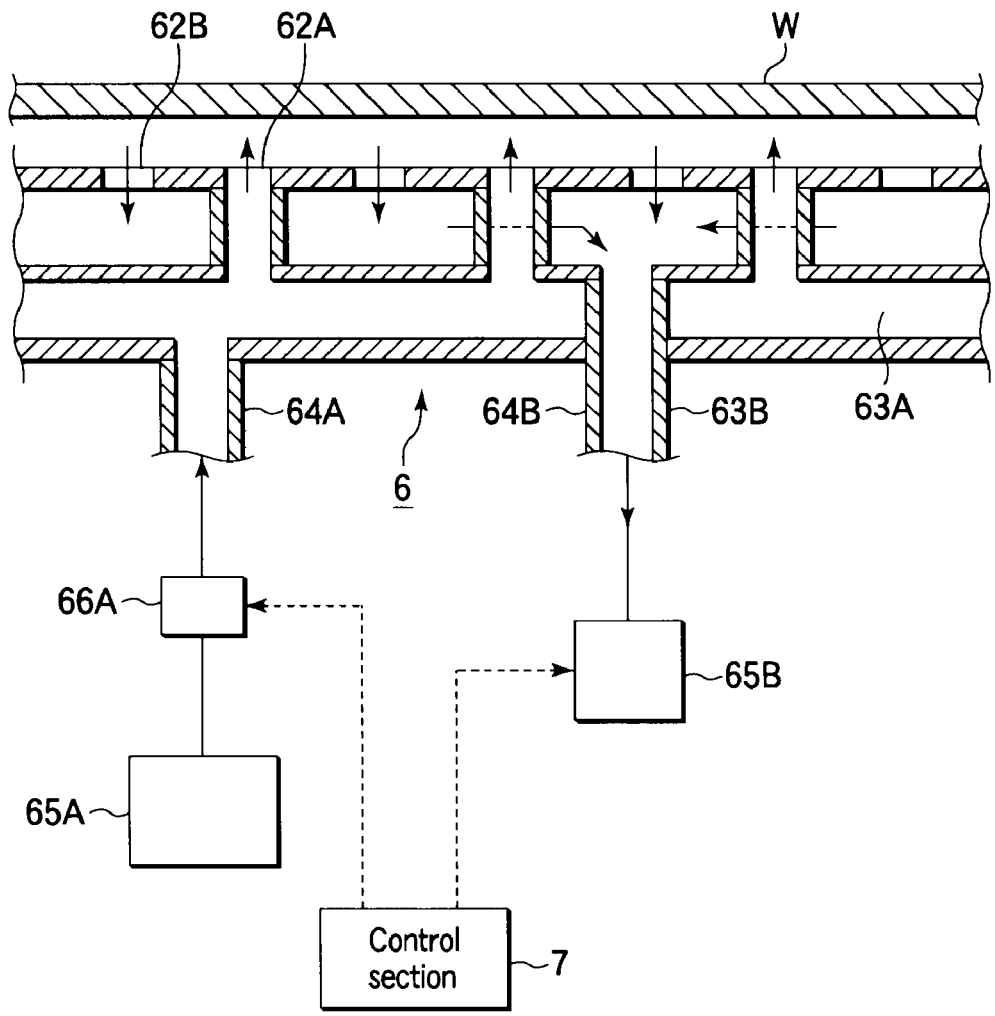

FIG. 6B is a sectional view of the casing 6A of the posture regulating mechanism 6, which is taken along an annular direction of the casing 6A. As shown in FIG. 6B, the gas delivery holes 62A and gas suction holes 62B respectively communicate with spaces 63A and 63B formed in the posture regulating mechanism 6. The space 63A is connected to, e.g., an air supply source 65A that stores air through a gas supply line 64A. The gas supply line 64A is provided with a flow rate control unit 66A including a valve and a mass-flow control. The flow rate control unit 66A is configured to receive a control signal from the control section 7 and thereby to control the supply, stop, and flow rate of air from the gas delivery holes 62A. The space 63B is connected to an exhaust unit 65B, such as a vacuum pump, through a gas suction line 64B. The exhaust unit 65B includes a pressure regulator (not shown), which is configured to receive a control signal from the control section 7 and thereby to control the suction amount through the gas suction holes 62B. Since the resist coating apparatus 2 is placed in the air atmosphere, air is used as a gas delivered from and sucked into the posture regulating mechanism 6. However, where it is placed in an inactive gas atmosphere, such as $N_2$ gas, this inactive gas may be delivered and sucked.

A region of the wafer W on an inner side of the region on which the liquid film is formed is supplied with air from the gas delivery holes 62A and thereby receives a vertically upward force. Further, this region is supplied with a suction force by the suction holes 62B and thereby receives a vertically downward force. The posture regulating mechanism 6 is configured to adjust the pressure balance composed of the forces in opposed directions, so as to control the posture of the peripheral portion of the wafer W being rotated and thereby to damp its vertical wobble.

Figure 7A:
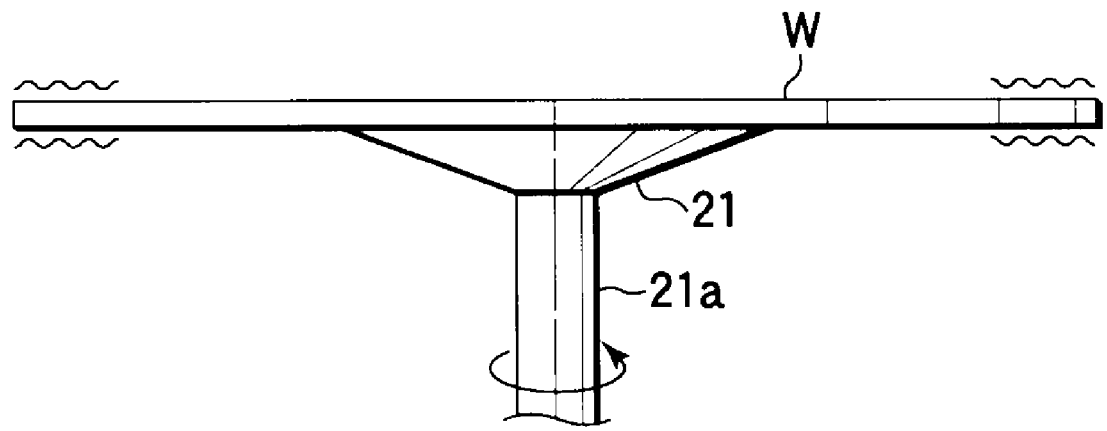
FIGS. 7A and 7B are views for explaining a manner of regulating the posture of a wafer by the posture regulating mechanism.
Figure 7B:
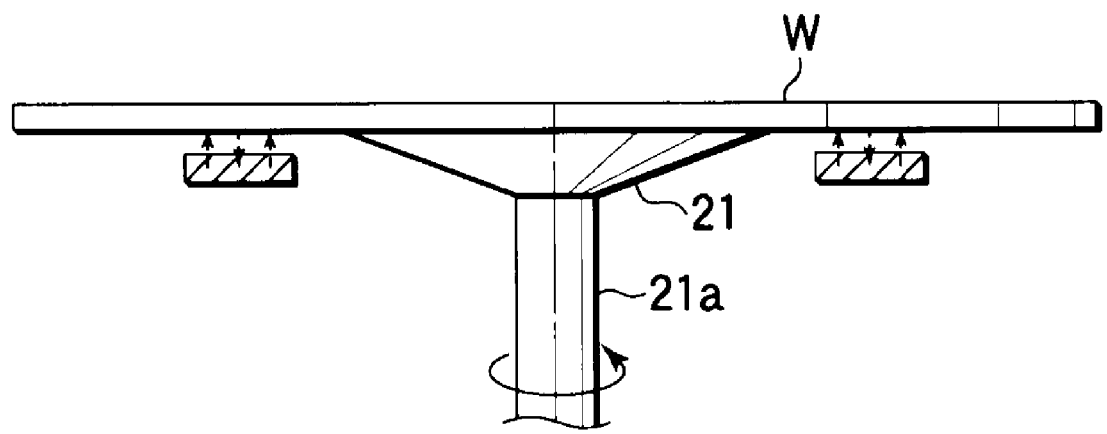

FIGS. 7A and 7B are views for explaining a manner of regulating the posture of a wafer by the posture regulating mechanism 6. If a wafer W is warped or the spin chuck 21 includes a horizontal level error, the peripheral portion of the wafer W may cause a vertical wobble of, e.g., about 100 μm while the wafer W is rotated, as shown in FIG. 7A. As described above, the liquid film forming mechanism 5 is disposed in proximity to the back side peripheral portion of the wafer, so that a liquid film L can be formed therebetween. If the degree of the vertical wobble is large, the distance between the counter face portion 51 of the liquid film forming mechanism 5 and the back side of the wafer W may become larger, or the wafer W may collide with the liquid film forming mechanism 5 and hinder the formation of the liquid film L. In light of this, where a liquid film is formed by the liquid film forming mechanism 5, the posture regulating mechanism 6 is set at a predetermined height position (working position), and a gas is supplied onto the back side of the wafer while the gas on the back side of the wafer W is sucked, as shown in FIG. 7B. Consequently, the peripheral portion of the wafer W is prevented from causing a vertical wobble, and the distance between the back side of the wafer W and the liquid film forming mechanism 5 is kept constant, so that liquid film L is formed all over the back side peripheral portion of the wafer W. In order to reliably form a liquid film, the wobble amount of the wafer W is preferably damped to, e.g., about 10 µm by use of the posture regulating mechanism 6.

The respective components of the resist coating apparatus 2 are connected to and controlled by a control section 7 that includes a process controller comprising a CPU. The process controller is connected to a user interface including, e.g. a keyboard and a display, wherein the keyboard is used for a process operator to input commands for operating the resist coating apparatus 2, and the display is used for showing visualized images of the operational status of the resist coating apparatus 2.

Further, the process controller is connected to a storage portion that stores recipes containing control programs (software), process condition data, and so forth recorded therein, for the process controller to control the resist coating apparatus 2 so as to perform various processes. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

Figure 9A:
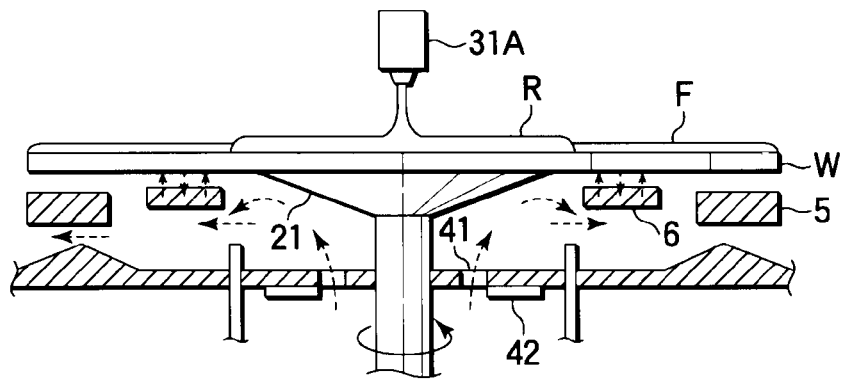
FIGS. 9A to 9D are views sequentially showing operations of the coating apparatus.
Figure 9B:
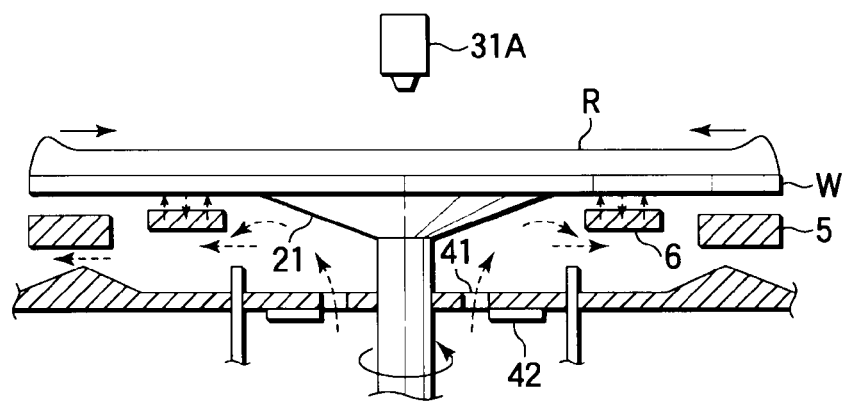
Figure 9C:
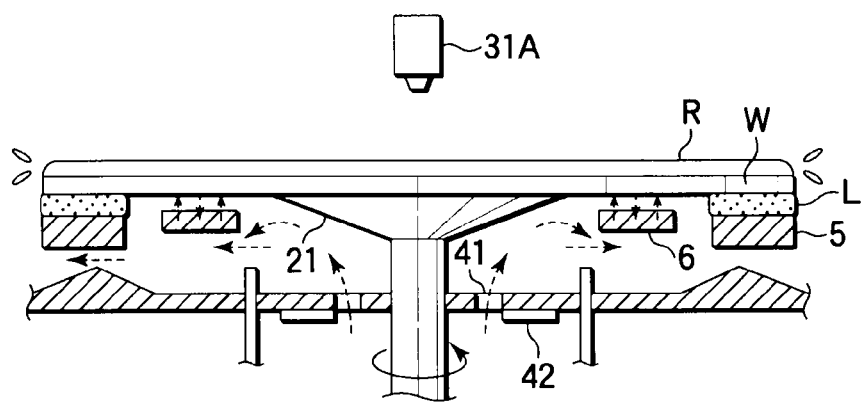
Figure 10A:
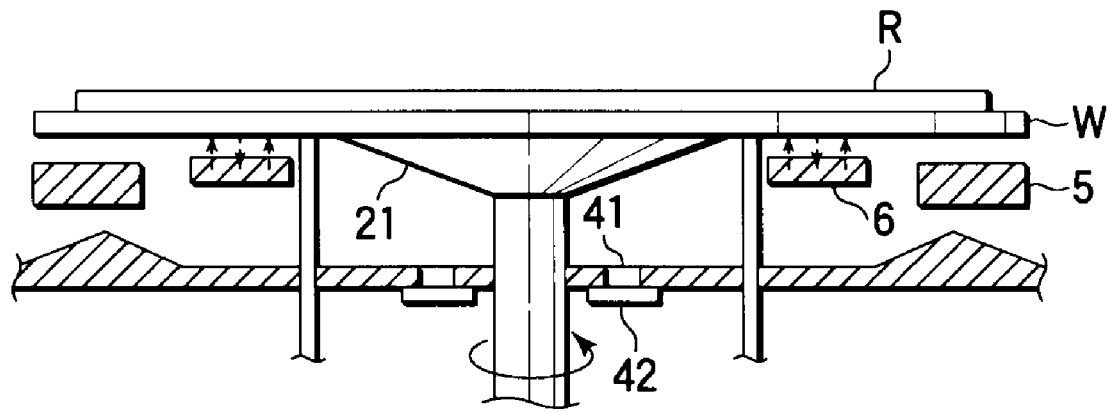
FIGS. 10A and 10B are views sequentially showing operations of the coating apparatus.
Figure 10B:
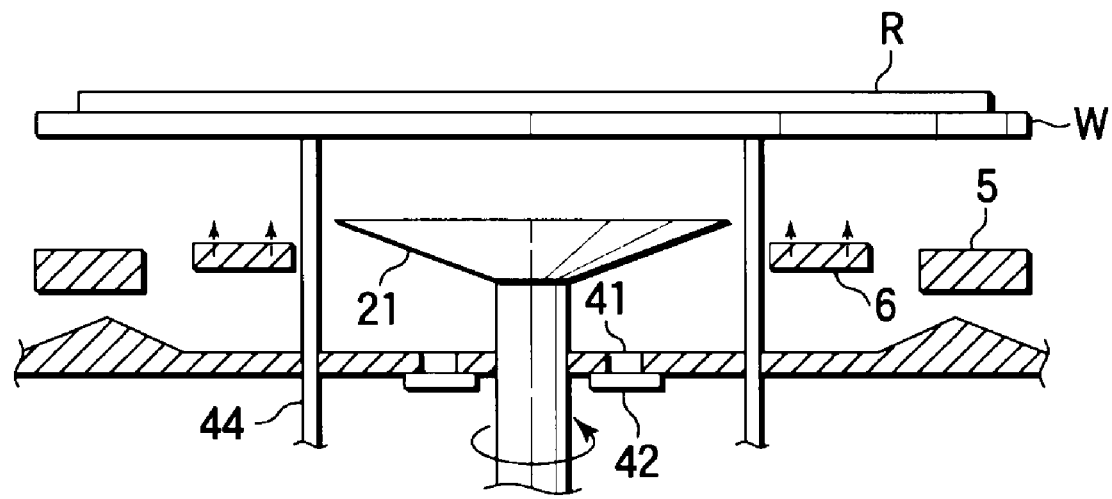
Figure 11:
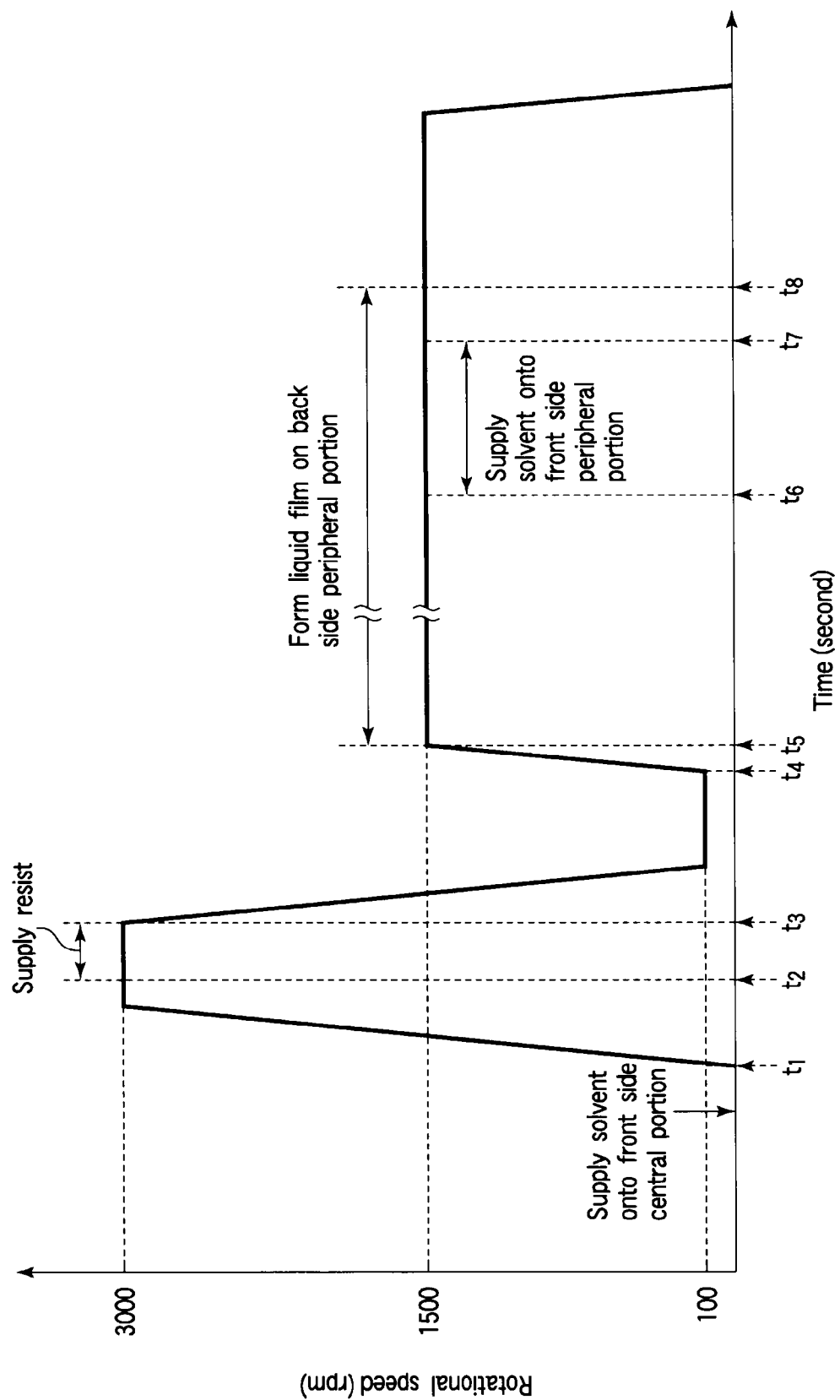
FIG. 11 is a graph showing the relationship among the operation, time, and wafer rotational speed in the coating apparatus.

Next, an explanation will be given of the operation of the resist coating apparatus 2, with reference to FIGS. 8A to 11. FIGS. 8A to 10B show operations of the respective components of the resist coating apparatus 2. FIG. 11 is a graph showing the relationship among the time, the rotational speed of a wafer W held on the spin chuck 21, and the process performed on the wafer W at each time point. At first, the interior of the cup body 24 is exhausted at a preset gas displacement, and a wafer W having a diameter of, e.g., 30 cm is transferred by a transfer mechanism (not shown) into the resist coating apparatus 2 from outside.

Figure 8A:
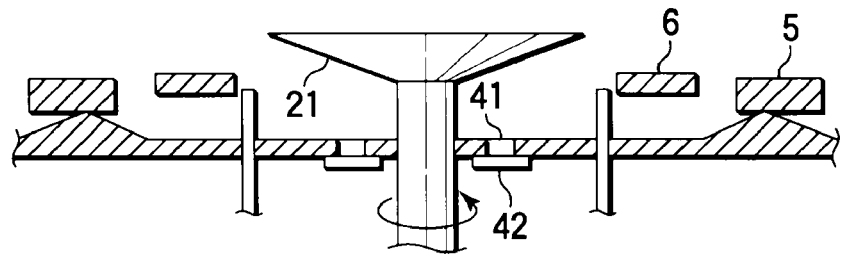
FIGS. 8A to 8D are views sequentially showing operations of the coating apparatus.
Figure 8B:
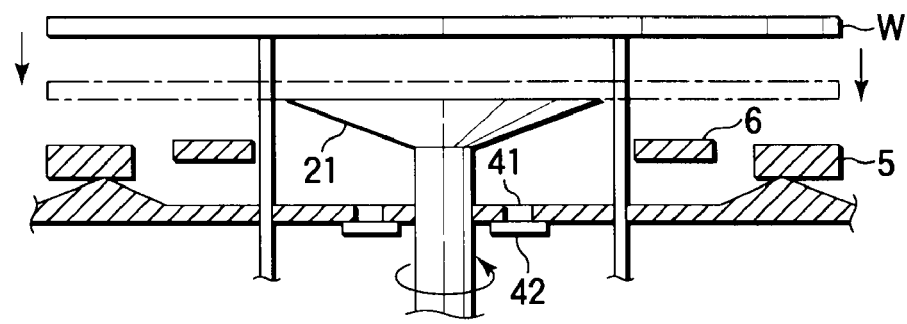

When the wafer W is positioned above the spin chuck 21, the support pins 44 are moved up and support the back side of the wafer W. Then, the support pins 44 are moved down, and the back side central portion of the wafer W is attracted and held on the spin chuck 21 by a suction force. Further, a predetermined amount of air is delivered from the gas delivery holes 62A of the posture regulating mechanism 6 (FIGS. 8A and 8B). At this time, the posture regulating mechanism 6 and liquid film forming mechanism 5 are waiting at their waiting positions below the working position for regulating the posture of the wafer W and the liquid film forming position, respectively. After the air delivery is started, the posture regulating mechanism 6 and liquid film forming mechanism 5 are moved up to the working position and liquid film forming position, respectively.

Figure 8C:
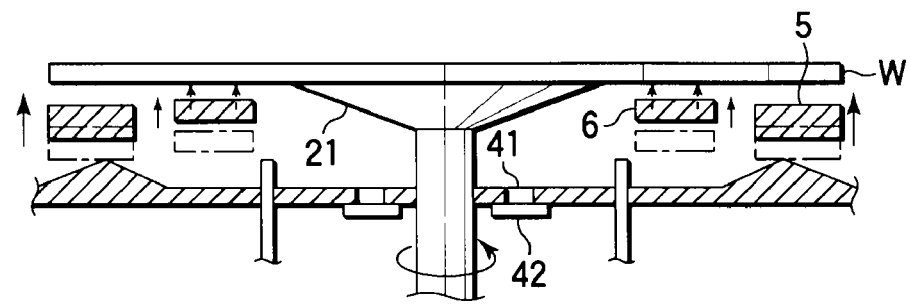

The air delivered from the posture regulating mechanism 6 provides a pressure that prevents the peripheral portion of the wafer W from falling, so that the peripheral portion of the wafer W does not come into contact with the liquid film forming mechanism 5 and posture regulating mechanism 6. In this way, the posture regulating mechanism 6 and liquid film forming mechanism 5 are set at the working position and liquid film forming position, respectively (FIG. 8C). Then, a solvent F is supplied from the solvent nozzle 31B onto the central portion of the wafer W, and this supply is stopped after a lapse of a time for supplying a predetermined amount of solvent.

Figure 8D:
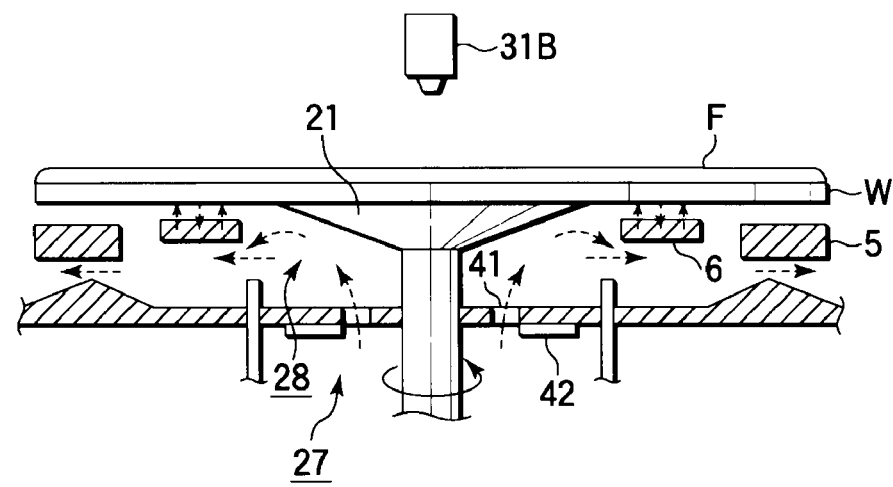

Thereafter, the gas suction holes 62B of the posture regulating mechanism 6 set at the working position starts applying a suction force on the back side of the wafer W and the spin chuck 21 is rotated (time point t1). While the distance between the back side of the wafer W and the liquid film forming mechanism 5 is kept at, e.g., 100 µm, the rotational speed is increased, so that the solvent F supplied on the wafer W is spread toward the peripheral portion of the wafer W by a centrifugal force. Further, the shutters 42 are opened almost simultaneously with the start of rotation of the spin chuck 21, and so air is caused to flow from the lower space 27 through the slits 41 into the upper space 28 around the spin chuck 21 in which the pressure is decreased due to the rotation of the wafer W. This air is involved in exhaust flows formed inside the cup body 24 and forms air flows headed from the back side central portion of the wafer W to the back side peripheral portion, as indicated with arrows, which are exhausted from the exhaust port 25 (FIG. 8D).

After the rotational speed is kept increased and reaches, e.g., 3,000 rpm (first rotational speed), a resist R is supplied from the resist nozzle 31A onto the central portion of the wafer W (time point t2). This resist R is spread on the front side of the wafer W wet with the solvent toward the peripheral portion by a centrifugal force (FIG. 9A). Then, the supply of the resist R is stopped, and the wafer rotational speed is decreased (time point t3) and is maintained at, e.g., 100 rpm, so that the film thickness planar distribution is improved in a less-dried state (FIG. 9B). Specifically, raised portions of the resist coating on the peripheral portion of the wafer W are attracted toward the central portion, and the film thickness thereby becomes uniform.

Thereafter, the rotational speed of the wafer W is increased (time point t4), and reaches, e.g., 1,500 rpm (second rotational speed). While the rotational speed is maintained at this value, superfluous part of the resist R is thrown off from the peripheral portion of the wafer W and mist M is thereby generated. Further, simultaneously with or slightly subsequently to the start of this increase of the rotational speed, a thinner in an amount of, e.g. 3 mL is supplied from the liquid film forming mechanism 5 into the gap between the liquid film forming mechanism 5 and the peripheral portion of the wafer W. The thinner is adsorbed by its surface tension on the wafer W and liquid film forming mechanism 5, and so a liquid film L is formed, as shown in FIG. 9C (time point t5).

Figure 12A:
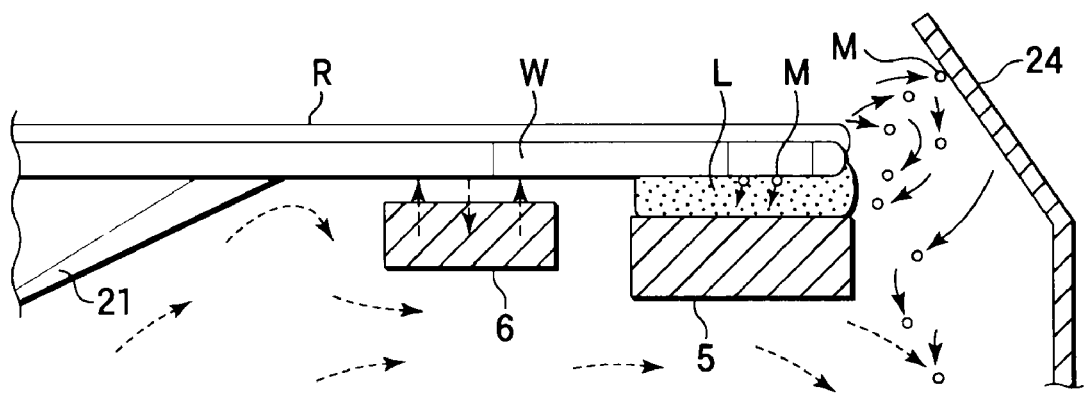
FIGS. 12A to 12C are views for explaining states of mist in the coating apparatus.
Figure 12B:
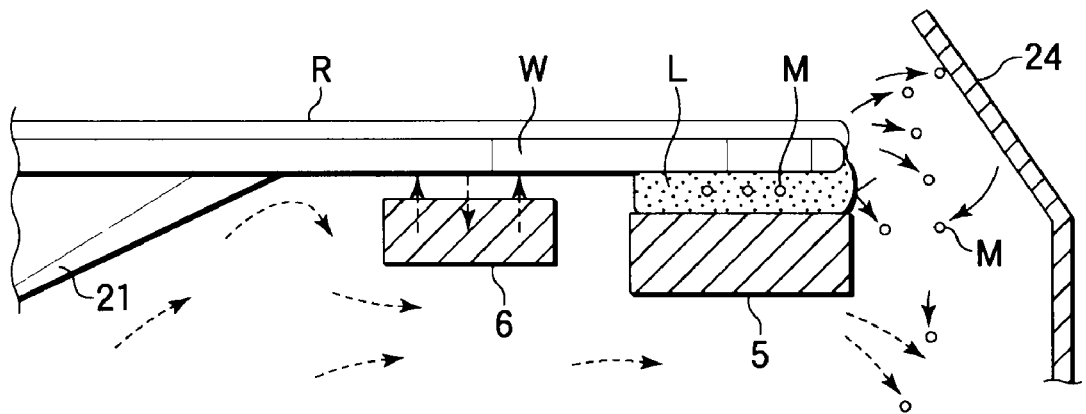

FIG. 12A shows a state of mist M generated at this time. Mist M and other particles deposited on the back side peripheral portion of the wafer W prior to the formation of this liquid film L are removed from the back side of the wafer W by a shearing force acting between the liquid film L and the back side of the wafer W being rotated. Further, mist M flowing toward the back side peripheral portion of the wafer is bounced on the surface of the liquid film L or is taken into the liquid film L when it reaches the liquid film L, as shown in FIG. 12B. Mist M thus taken into the liquid film L is prevented from being deposited on the wafer W due to a force acting between the wafer W and liquid film L, as described above. At this time, as shown in FIGS. 12A and 12B, mist M that has collided with the cup body 24 from the wafer W and bounced toward the central portion of the wafer W is involved in gas flows supplied through the slits 41 and thereby exhausted, and so this mist M is prevented from being deposited on the wafer W.

Figure 9D:
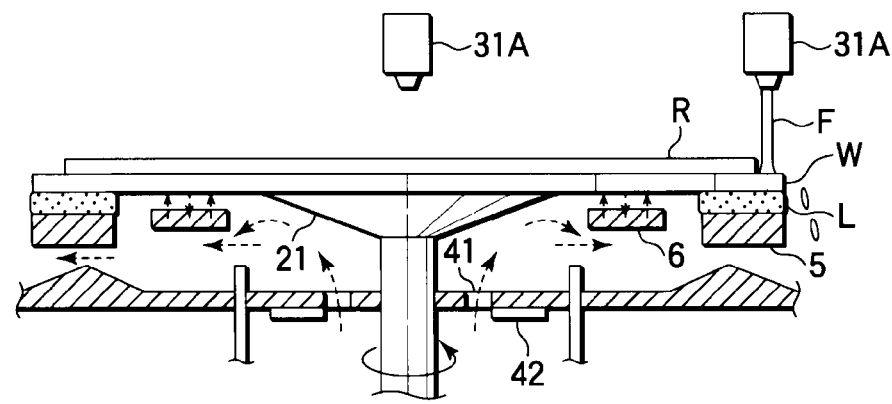
Figure 12C:
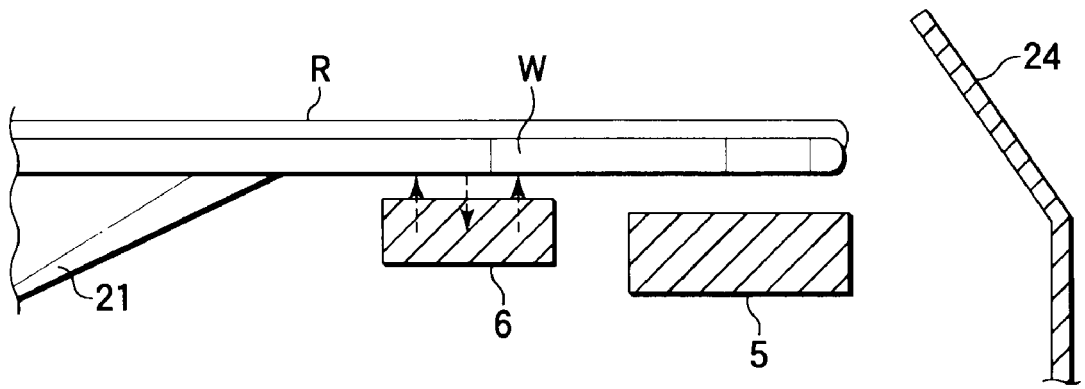

After superfluous part of the resist R is thrown off, the film thickness is controlled to be a predetermined value, and the resist film R is dried to a certain extent, as described above, a solvent is supplied from the solvent nozzle 31C onto the peripheral portion of the wafer W (time point t6), so that part of the resist R on the peripheral portion is dissolved (FIG. 9D). When this part of the resist R is dissolved, mist is also generated. However, this mist is prevented from being deposited on the wafer W because it is trapped in the liquid film L and/or exhausted along with gas flows supplied from the slits 41, as in the mist generated in throwing off superfluous part of the resist. Then, the supply of the solvent from the solvent nozzle 31C is stopped (time point t7), and, after a while, as shown in FIGS. 10A and 12C, the thinner used for forming the liquid film L is sucked and removed by the suction holes 52B of the liquid film forming mechanism 5 along with mist M trapped therein, and the shutters 42 are closed (time point t8).

After the liquid film formation is stopped, the wafer W is kept rotated for a while, so that the thinner used for forming the liquid film L and deposited on the peripheral portion is dried. Then, the rotation of the wafer W is stopped, the sucking by the posture regulating mechanism 6 is stopped, and the wafer W is transferred onto the external transfer mechanism by use of a sequence opposite to that for loading (FIG. 10B).

As described above, this resist coating apparatus 2 includes the liquid film forming mechanism 5 and posture regulating mechanism 6 both disposed to face the back side of the wafer W being rotated, wherein the liquid film forming mechanism 5 has a ring shape extending along the peripheral portion of the wafer W, and the posture regulating mechanism 6 is used to damp the vertical wobble of the peripheral portion. A thinner is supplied into a gap between the liquid film forming mechanism 5 and the back side peripheral portion of the wafer W, so that a liquid film of the thinner is formed by its surface tension between the peripheral portion of the wafer W and the liquid film forming mechanism 5. The liquid film prevents mist from being deposited on the back side peripheral portion of the wafer W. Accordingly, there is no need to supply a solvent from a nozzle or the like onto the peripheral portion of the wafer W to wash out mist, and so the solvent consumption is reduced.

Further, in the resist coating apparatus 2, when the rotational speed of the wafer W is increased from 100 rpm to 1,500 rpm and the mist can be thereby easily generated, the shutters 42 are opened, so that air flows from the lower space 27 into the upper space 28 and further flows along the peripheral portion of the wafer W. Consequently, mist is prevented from being deposited on a region of the wafer W on an inner side of the region on which the liquid film is formed. Although the shutters 42 may be kept opened, they are preferably opened to supply air from the lower space 27 into the upper space 28 only when mist is generated as described above, so that the service life of the filter provided on the slits 41 can be effectively prolonged. The opening/closing timing of the shutters is not limited to the example described above, and the shutters may be switched from the closed state to an opened state at the time point t5 when mist can be more easily generated, for example. In place of the use of the slits 41, the liquid film forming mechanism 5 may be enlarged to extend from the peripheral portion of the wafer W toward the central portion, so that mist is prevented from being deposited on the back side central portion of the wafer W. However, since mist can less likely flow onto the back side central portion of the wafer W as compared with the back side peripheral portion, the use of the slits 41 is effective to reduce the thinner consumption.

Further, in place of the use of the slits, a nozzle or the like for supplying air onto the back side of the wafer W may be disposed to control the pressure on the back side of the wafer W by this air supply and to form air flows on the back side of the wafer W from the central portion toward the peripheral portion, so that mist is prevented from being deposited on the wafer W.

Incidentally, in the embodiment described above, the period of the time points t2 to t4 before the rotational speed of the wafer W is increased to 1,500 rpm is used as a period for adjusting the film thickness distribution of the resist film to be uniform. In this embodiment, the liquid film L is not formed in this period, so that the film thickness distribution is prevented from being fluctuated due to a change in the temperature of the front side of the wafer W caused by the temperature of the thinner of the liquid film L.

When the thinner of the liquid film is removed by the suction holes 52B after the liquid film is formed, mist trapped in the liquid film is removed along with the thinner, and so the particle contamination due to the mist is reliably reduced. Further, after the liquid film is formed, the wafer W is kept rotated to dry the thinner deposited on the wafer W, so that this residual thinner can be advantageously prevented from causing particle contamination.

The posture regulating mechanism 6 includes the delivery holes 62A and suction holes 62B alternately arrayed in the rotational direction and radial direction of the wafer W, and so the pressure on the wafer W becomes uniform in the annular direction and the wafer W can be rotated while its vertical wobble is being damped. The delivery holes 62A and suction holes 62B are not limited to this example, and they may be formed as slits arrayed in annular directions about the rotational center of the wafer W, for example.

As described above, the liquid film forming mechanism 5 and posture regulating mechanism 6 can be moved to the liquid film forming position and working position, respectively, at which they do not come into contact with the wafer W. Since the wafer W is prevented from receiving a mechanical shock due to collision with the liquid film forming mechanism 5 or posture regulating mechanism 6, the films formed on the wafer W do not suffer defects generated by the mechanical shock.

Figure 13A:
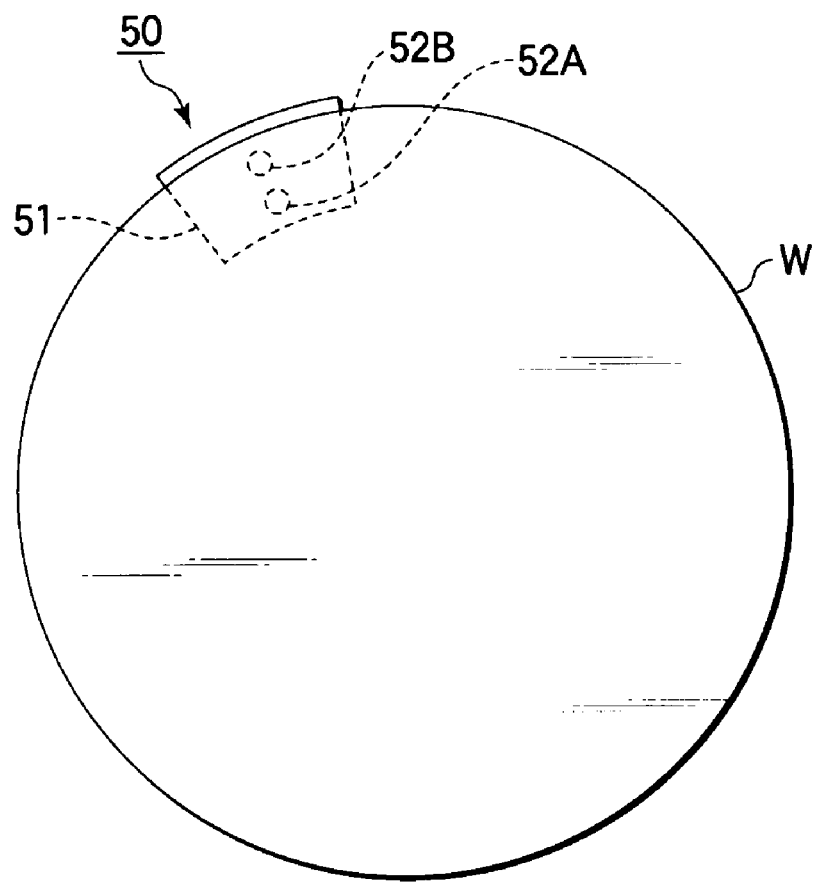
FIGS. 13A and 13B are views for explaining an alternative example of the posture regulating mechanism.
Figure 13B:
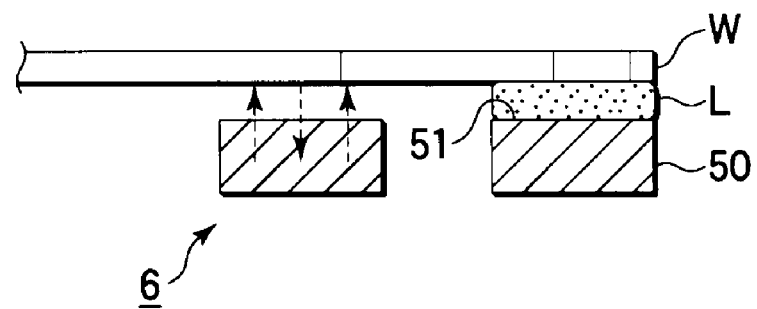

In the liquid film forming mechanism 5, the layout of the supply holes 52A and suction holes 52B is not limited to the example described above, as long as it allows a liquid film L to be formed. For example, the structure described above includes a plurality of supply holes 52A for supplying a thinner, but it may alternatively include a single supply hole for the same purpose. Even if a liquid film is formed only on one position of the back side peripheral portion of the wafer W, cleaning can be applied to the entire back side peripheral portion of the wafer W because of rotation of the wafer W. Accordingly, the liquid film forming mechanism 5 is not limited to a ring shape, and a liquid film forming mechanism 50 that faces part of the peripheral portion of the wafer W may be used, as shown in FIG. 13A. However, the liquid film is preferably formed to have a ring shape as described above, because this shape can more reliably block mist so that mist does not flow onto the back side of the wafer W.

Figure 14A:
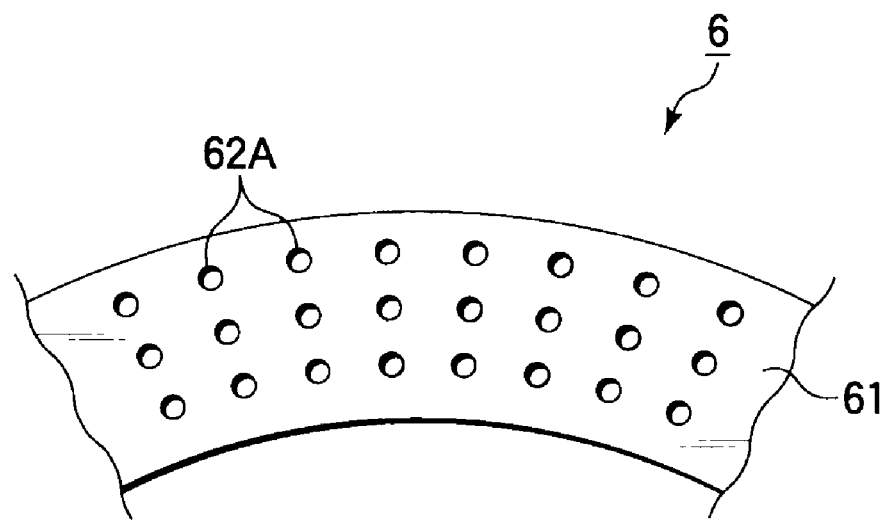
FIGS. 14A and 14B are views for explaining another alternative example of the posture regulating mechanism.
Figure 14B:
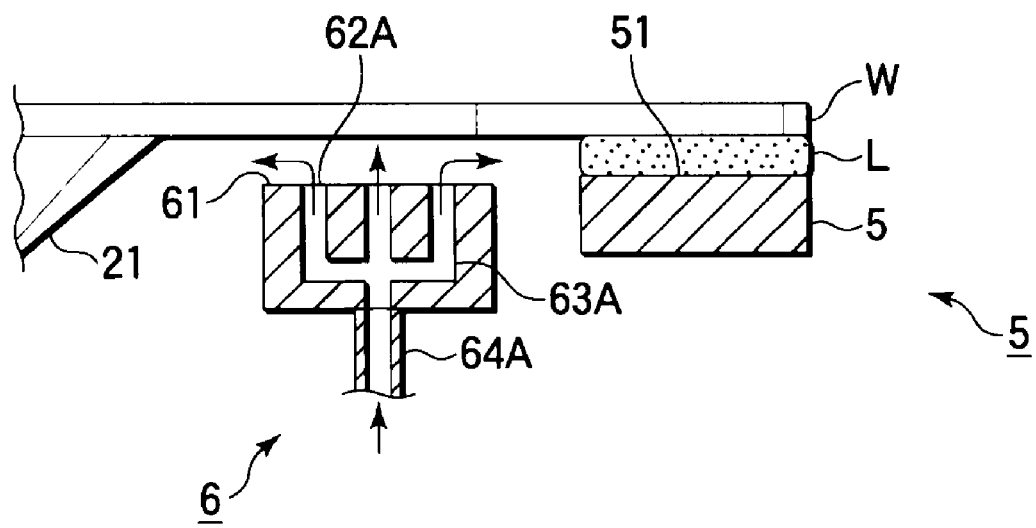

The posture regulating mechanism 6 described above is arranged to deliver air onto the back side of the wafer W and to suck in gas on the back side of the wafer W, so that the posture of the peripheral portion of the wafer W is controlled. However, such control of the posture of the wafer W is not limited to this example. For example, a posture regulating mechanism 6 shown in FIG. 14A includes only a number of delivery holes 62A arrayed in annular directions of the wafer W without suction holes. In this case, as shown in FIG. 14B, air is delivered from this posture regulating mechanism 6 onto the back side of the wafer W to damp the vertical wobble of the wafer W. Further, for example, the working position of the posture regulating mechanism 6 may be arranged to provide Bernoulli Effect when air delivered onto the back side of the wafer W flows in the gap between the wafer W and posture regulating mechanism 6. Specifically, according to the posture regulating mechanism 6 thus arranged, the wafer W is attracted toward the posture regulating mechanism 6, while the wafer W receives the pressure of air delivered from the delivery holes 62A, so that the wafer W is separated from the posture regulating mechanism 6 in a non-contact state. Accordingly, the distance between the counter face portion 51 of the liquid film forming mechanism 5 and the back side of the wafer W is kept constant, and so the wobble amount of the peripheral portion of the wafer W being rotated is reduced.

The embodiment described above is exemplified by a resist coating apparatus, but the present invention may be applied to another coating apparatus arranged to perform spin coating for film formation while a chemical liquid is supplied onto the center of a substrate and is spread toward the peripheral portion of the substrate being rotated. In the embodiment described above, part of the resist film on the peripheral portion is removed, because, when a water repellent protection film is formed on the resist film in a subsequent step to prepare for immersion light-exposure, the peripheral portion of the protection film adheres well to the front side of the wafer W. However, this removal of the resist film on the peripheral portion may be omitted.

In the embodiment described above, a thinner may be, kept supplied into the gap between the wafer W and liquid film forming mechanism 5 during formation of the liquid film L to prevent the formation of the liquid film L from being hindered due to drying and/or scattering of the thinner during the process. Also in this case, the distance H1 between the wafer W and liquid film forming mechanism is very small, and so the thinner consumption can be smaller as compared to a case where a thinner is delivered from a nozzle to wash out mist. Further, the liquid film L may be formed such that a thinner is supplied from the supply holes 52A of the counter face portion 51 while the thinner is sucked in by the suction holes 52B.

Figure 15:
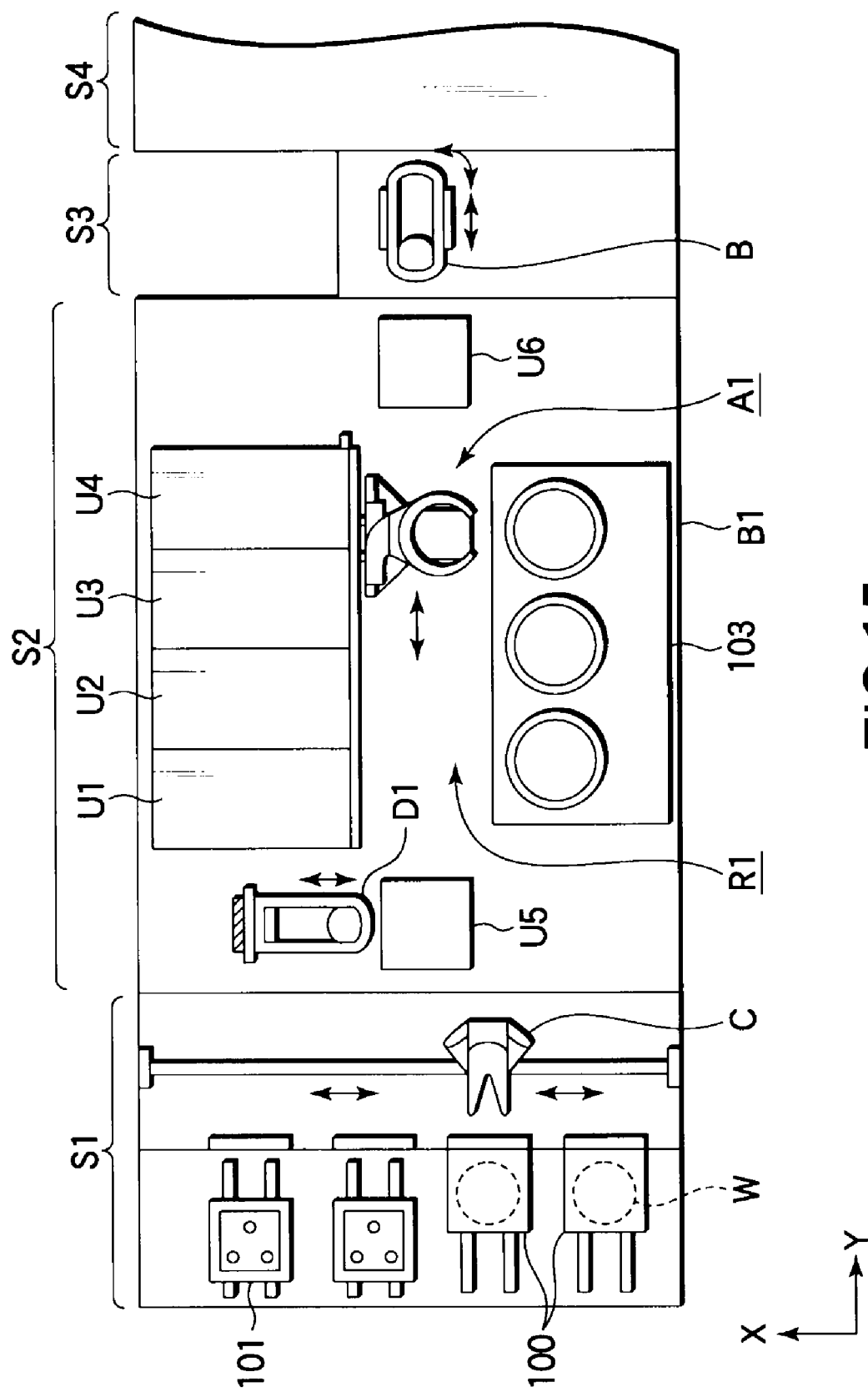
FIG. 15 is a plan view showing a coating/developing apparatus including the coating apparatus.
Figure 16:
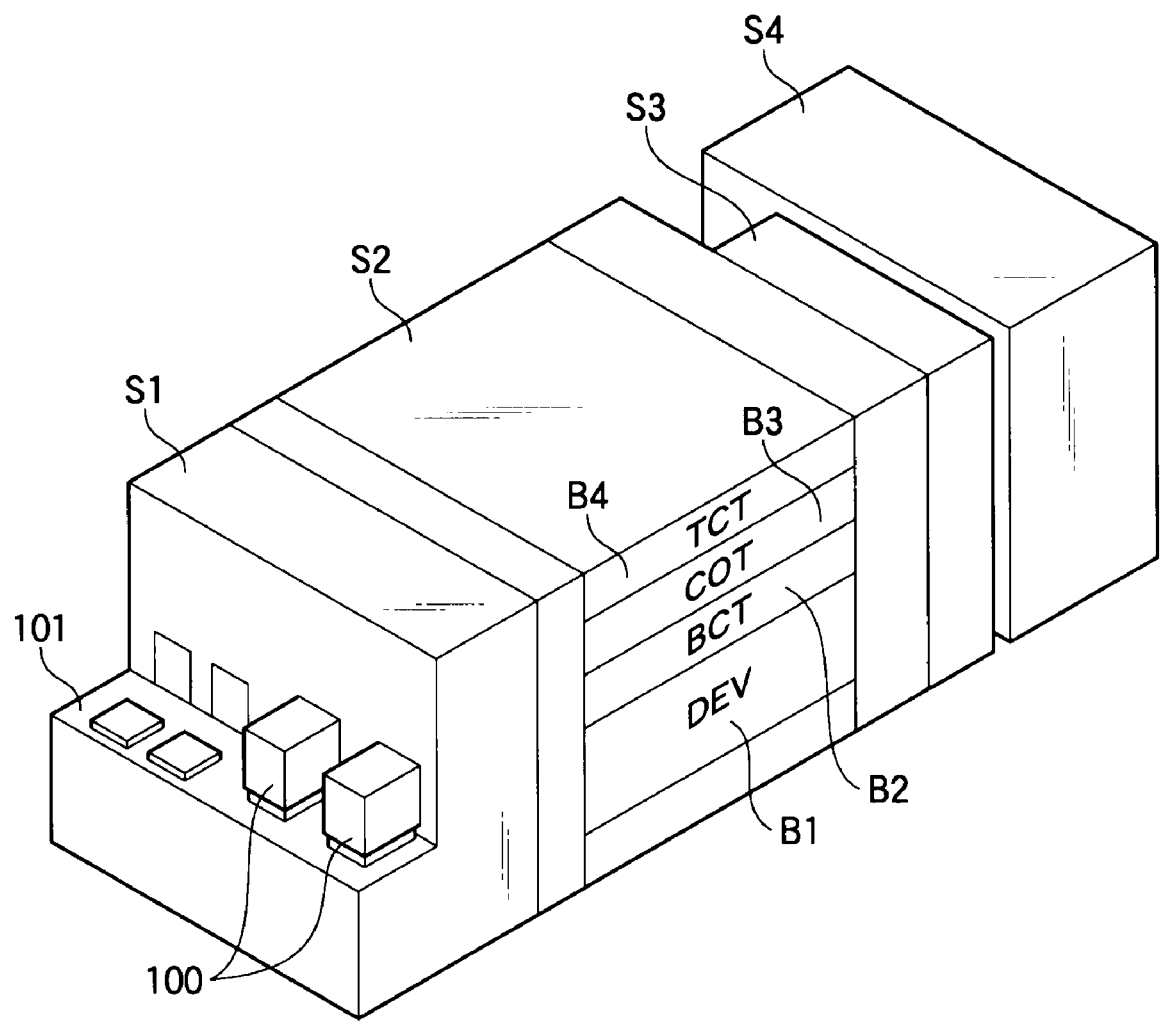
FIG. 16 is a perspective view showing the coating/developing apparatus including the coating apparatus.
Figure 17:
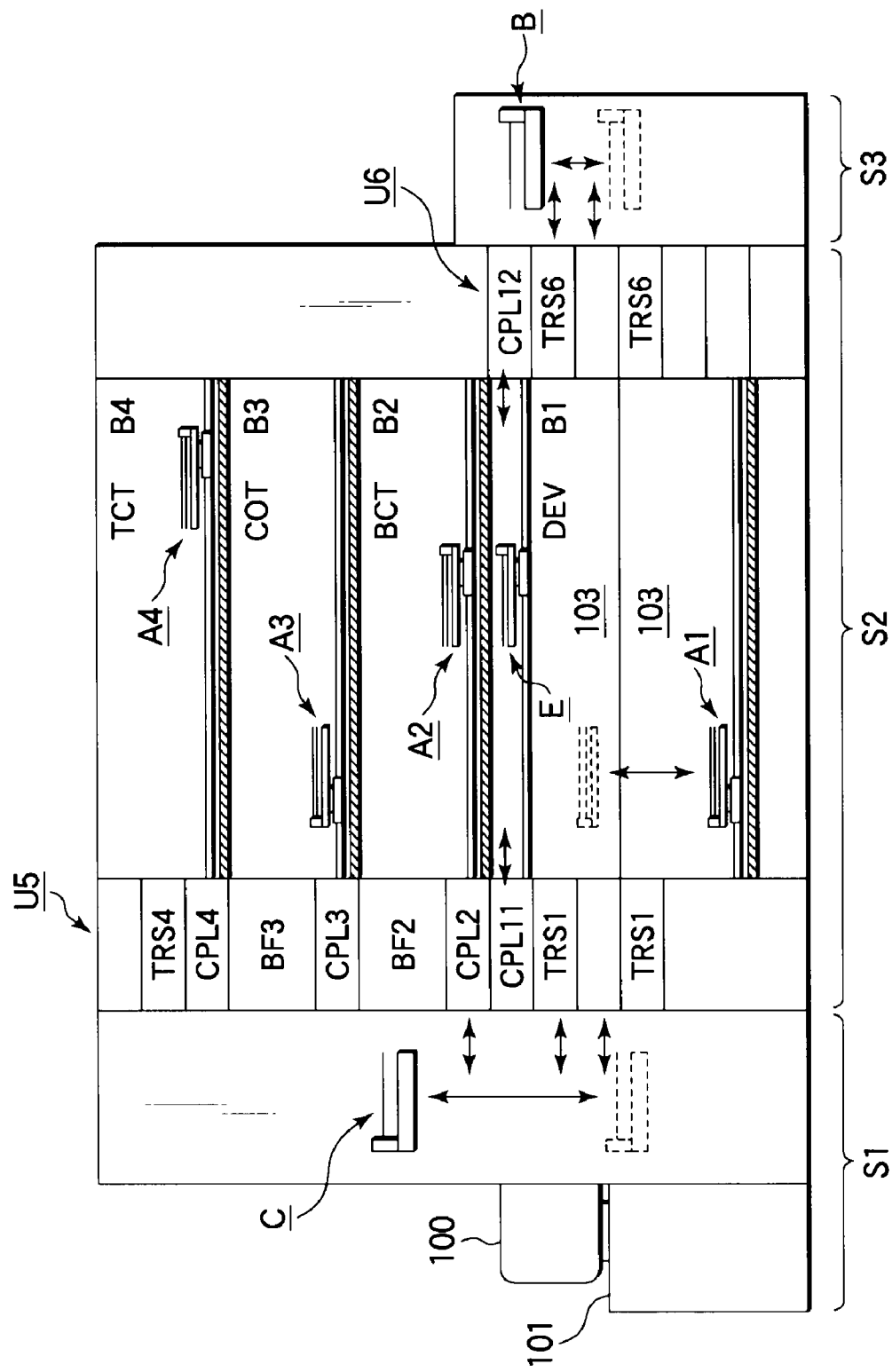
FIG. 17 is a sectional side view showing the coating/developing apparatus including the coating apparatus.

Next, a brief explanation will be given of an example where the resist coating apparatus 2 described above is applied to a coating/developing apparatus. FIG. 15 is a plan view showing a system including a coating/developing apparatus and a light-exposure apparatus connected thereto. FIG. 16 is a perspective view of the system. FIG. 17 is a sectional side view of the system. This apparatus includes a carrier block S1 with a table 101 on which carriers 100 of an airtight type are placed. A transfer arm C is disposed to take out wafers W from the carriers 100 and transfer them to a process block S2, and to receive processed wafers W from the process block S2 and return them to the carriers 100.

In this example, as shown in FIG. 15, the process block S2 includes a first block (DEV layer) B1 for performing a developing process, a second block (BCT layer) B2 for forming an anti-reflection film disposed below a resist film, a third block (COT layer) B3 for applying the resist film, and a fourth block (TCT layer) B4 for forming a protection film disposed above the resist film to protect the resist film in, e.g., immersion light-exposure, which are stacked in this order from below.

Each of the second block (BCT layer) B2 and fourth block (TCT layer) B4 includes a coating module for applying a chemical liquid by spin coating to form the anti-reflection film or protection film. Each of the coating modules is structured as in the coating apparatus 2 described above, except that the coating liquid differs therefrom. Each of the blocks B2 and B4 further includes a heating/cooling type process module group for performing a pre-treatment and a post-treatment performed before and after the process of the coating module. A transport arm A2 or A4 is disposed between the coating module and process module group to transfer wafers W between these portions. The third block (COT layer) B3 has the same structure except that the chemical liquid is a resist liquid, wherein the coating apparatus 2 described above is disposed as the coating module of this COT layer.

On the other hand, as shown in FIG. 17, the first block (DEV layer) B1 includes two developing modules 103 stacked one on top of the other inside the DEV layer B1. The DEV layer B1 includes a transport arm A1 for transferring wafers W to and from the two developing modules 103. In other words, the transport arm A1 is commonly used for the developing modules 103 disposed on upper and lower sides.

As shown in FIGS. 15 and 17, the process block S2 further includes a shelf module column U5. Wafers W are sequentially transferred from the carrier block S1 into one of the transit modules of the shelf module column U5, such as a transit module CPL2 corresponding to the second block (BCT layer) B2, by a first transfer arm D1 disposed near the shelf module column U5 and movable up and down. Each of the wafers W is received and transferred by the transport arm A2 of the second block (BCT layer) B2 from the transit module CPL2 into the respective modules (the anti-reflection film module and heating/cooling type process module group), by which an anti-reflection film is formed thereon.

Thereafter, each of the wafers W is transferred through a transit module BF2 of the shelf module column U5, the transfer arm D1, a transit module CPL3 of the shelf module column U5, and the transport arm A3 into the third block (COT layer) B3, in which a resist film is formed thereon. Further, the wafer W is transferred by the transport arm A3 into a transit module BF3 of the shelf module column U5. The wafer W with the resist film formed thereon may be transferred to the fourth block (TCT layer) B4, in which a protection film is formed thereon to protect the resist film during immersion light-exposure. In this case, the wafer W is transferred through a transit module CPL4 to the transport arm A4, then supplied with the protection film, and then transferred by the transport arm A4 into a transit module TRS4.

On the other hand, a shuttle arm E is disposed inside the DEV layer B1 at an upper position and is exclusively used as a transfer device for directly transferring a wafer W from a transit module CPL11 of the shelf module column U5 into a transit module CPL12 of a shelf module column U6. The wafer W with the resist film and anti-reflection film formed thereon, or further with the protection film formed thereon in addition to the former films, is transferred through the transfer arm D1 and transit modules BF3 and TRS4 into the transit module CPL11. Then, the wafer W is directly transferred by the shuttle arm E to the transit module CPL12 of the shelf module column U6, and is taken into an interface block S3. The transit modules denoted with "CPL" in FIG. 17 serve as cooling modules for temperature adjustment, as well. The transit modules denoted with "BF" in FIG. 17 serve as buffer modules that can accommodate a plurality of wafers W together.

Thereafter, the wafer W is transferred by an interface arm B into a light-exposure apparatus S4, in which a predetermined light-exposure process is performed thereon. Then, the wafer W is placed in a transit module TRS6 of the shelf module column U6 and is returned to the process block S2. The wafer W thus returned is then subjected to a developing process in the first block (DEV layer) B1. The wafer W with the protection film formed thereon may be subjected to a process for removing the protection film in a removal module disposed on the transfer passage from the light-exposure apparatus S4 to the DEV layer B1 to remove the protection film. After the developing process, the wafer W is transferred by the transport arm A1 into a transit module TRS1 of the shelf module column U5. Then, the wafer W is transferred by the first transfer arm D1 into a transit module of the shelf module column U5 within the access range of the transfer arm C, and then is returned by the transfer arm C into a carrier 100. Reference symbols U1 to U4 in FIG. 15 denote thermal module groups in which heating portions and cooling portions are stacked one on top the other. FIG. 15 shows the planar layout of the DEV layer B1, and the other layers have the same planar layout as that of the DEV layer.

<Evaluation Tests>

Figure 18:
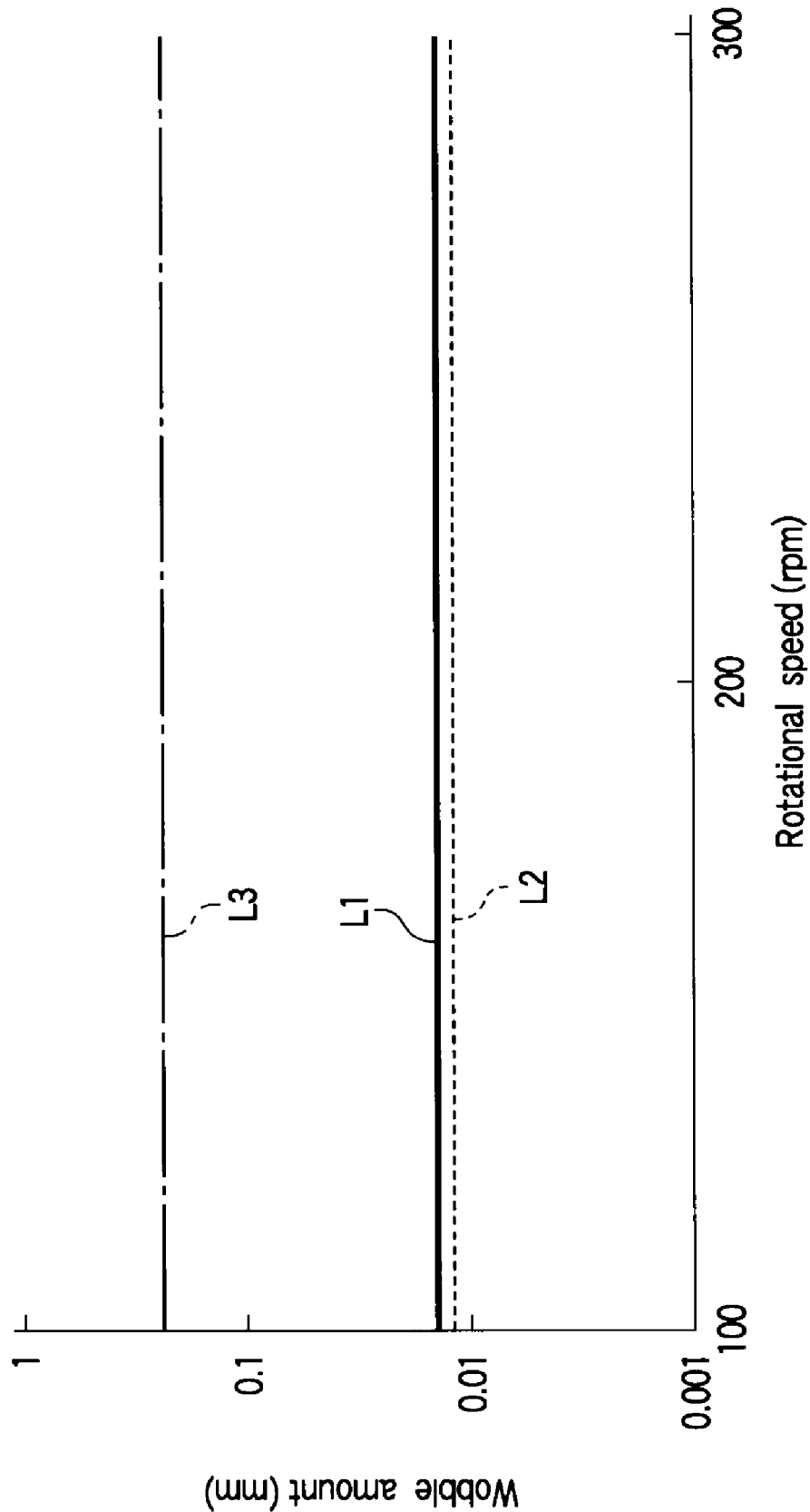
FIG. 18 is a graph showing results of an evaluation test.

Evaluation Test 1:

With use of the posture regulating mechanism 6 described above, the vertical wobble amount of the peripheral portion of a wafer W held on the spin chuck 21 was measured while the rotational speed of the wafer W was set at different values within a range of 100 rpm to 300 rpm. Further, without use of the posture regulating mechanism 6, the vertical wobble amount of the wafer W being rotated was measured in the same way. FIG. 18 is a graph showing results of this test, wherein the horizontal axis denotes the rotational speed (rpm) and the vertical axis denotes the wobble amount (mm). The solid line L1 represents a result obtained when each of the gas supply amount from the posture regulating mechanism 6 and the suction amount to the posture regulating mechanism 6 was set at 15 L/minute. The broken line L2 represents a result obtained when each of the gas supply amount from the posture regulating mechanism 6 and the suction amount to the posture regulating mechanism 6 was set at 50 L/minute. The chain line L3 represents a result obtained when the posture regulating mechanism 6 was not used. As shown in FIG. 18, where the posture regulating mechanism 6 was used, the wobble amount was reduced, as compared to the case where the posture regulating mechanism 6 was not used. Accordingly, it is estimated in this case that a liquid film can be stably formed in the small gap between the liquid film forming mechanism 5 and the peripheral portion of the wafer W, as described above.

Figure 19A:
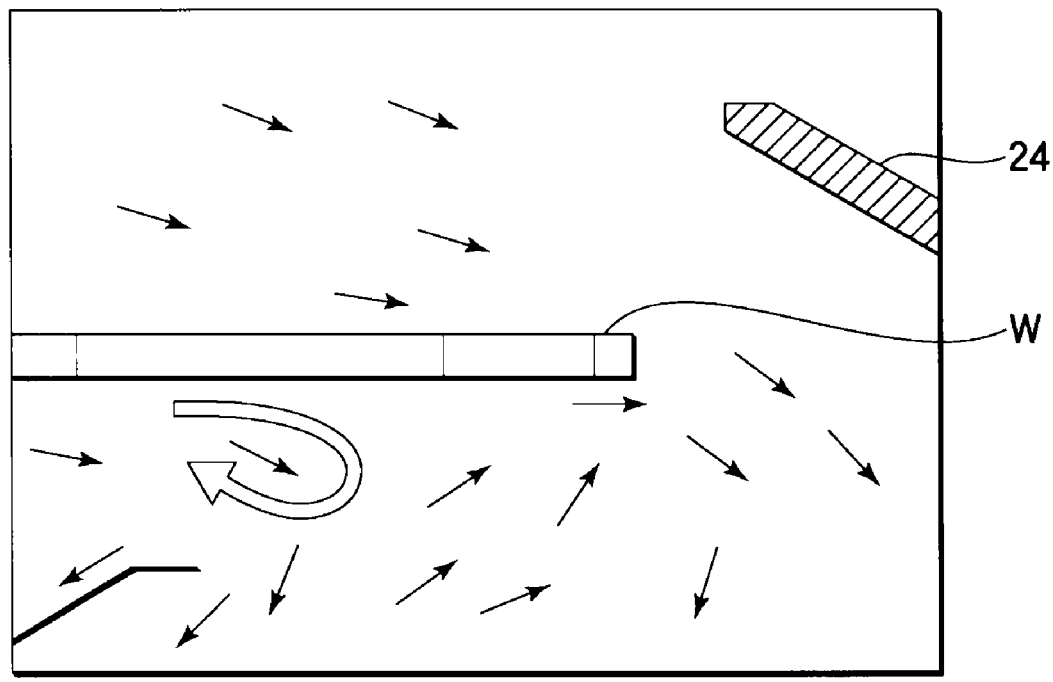
FIGS. 19A and 19B are views showing results of an evaluation test.

Evaluation test 2:

The direction of air flows flowing around the peripheral portion of a wafer W was simulated in a case where the slits 41 described above was not formed in the partition plate 23 so as not to generate gas flows from the lower space 27 into the upper space and in a case where the slits 41 was formed to generate gas flows from the lower space 27 into the upper space. The rotational speed of the wafer W was set at 1,500 rpm. FIG. 19A shows results of a simulation without the slits 41, wherein thin arrows represent gas flows thus generated and a thick arrow represents the main trend of the gas flows below the wafer W. In this case, air flows were generated such that they flowed from the back side central portion of the wafer W to the back side peripheral portion and then flowed from the back side peripheral portion of the wafer W to the back side central portion at a current velocity of 0.2 m/second.

Figure 19B:
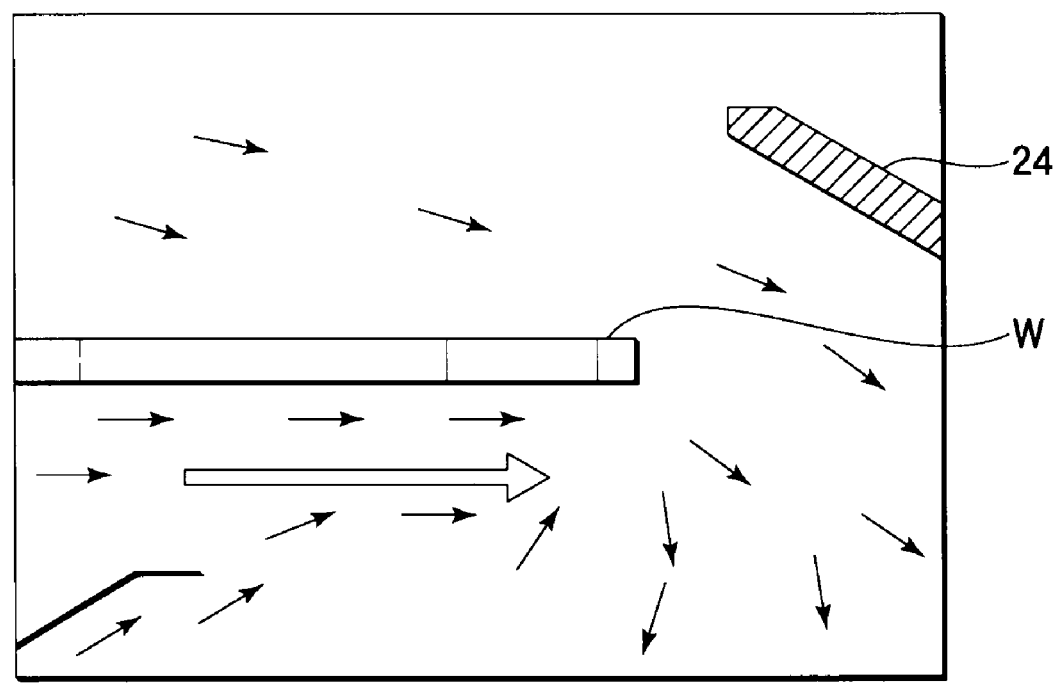

FIG. 19B shows results of a simulation with the slits 41, wherein thin arrows represent gas flows thus generated and a thick arrow represents the main trend of the gas flows below the wafer W. The slits 41 allowed gas to flow from the lower space 27 into the upper space 28 at a 100 L/minute. In this case, air flows were generated such that they flowed from the back side central portion of the wafer W to the peripheral portion of the wafer W at 1.0 m/second, without flows shown in FIG. 19A that flowed from the peripheral portion of the wafer W to the central portion. Accordingly, it has been found that the use of the slits 41 is effective to sweep mist toward the outer edge of the wafer W so as to prevent the mist from being deposited on the central portion of the wafer W.

Figure 20A:
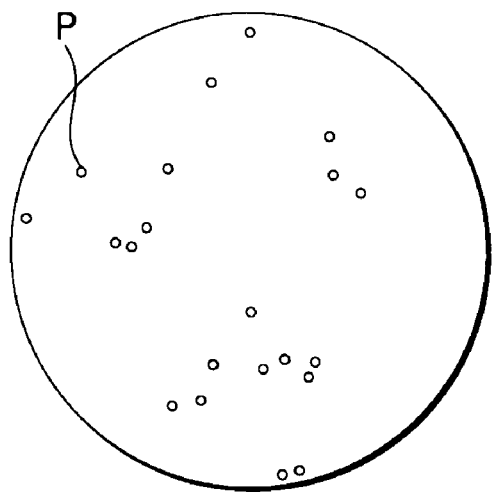
FIGS. 20A to 20D are plan views showing results of an evaluation test.
Figure 20B:
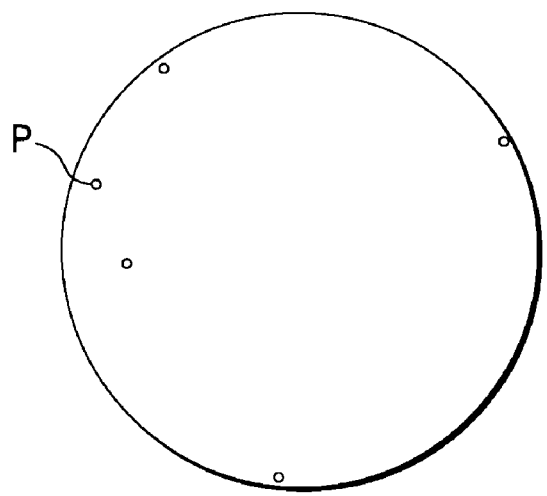
Figure 20C:
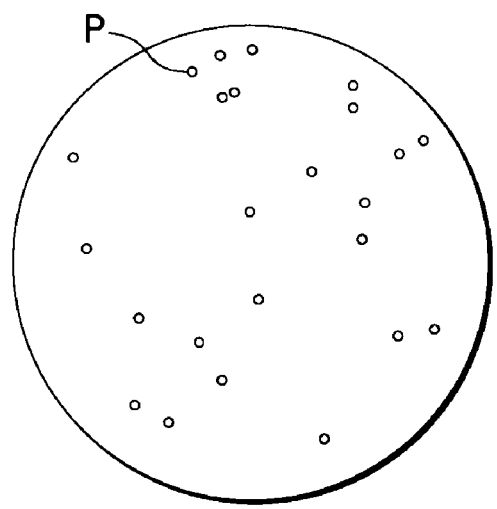
Figure 20D:
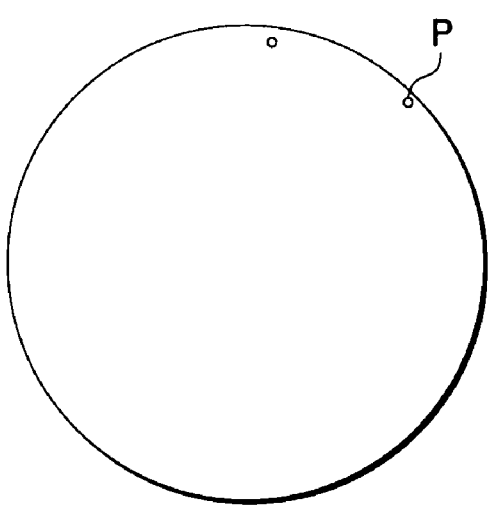
Figure 24A:
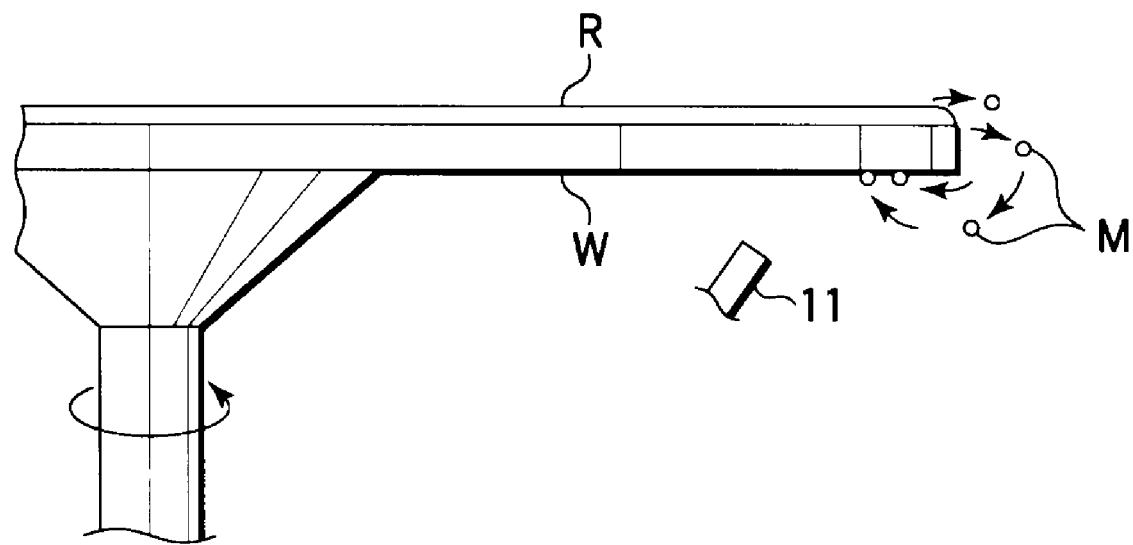
FIGS. 24A and 24B are views for explaining a conventional cleaning method performed on the back side of a wafer.
Figure 24B:
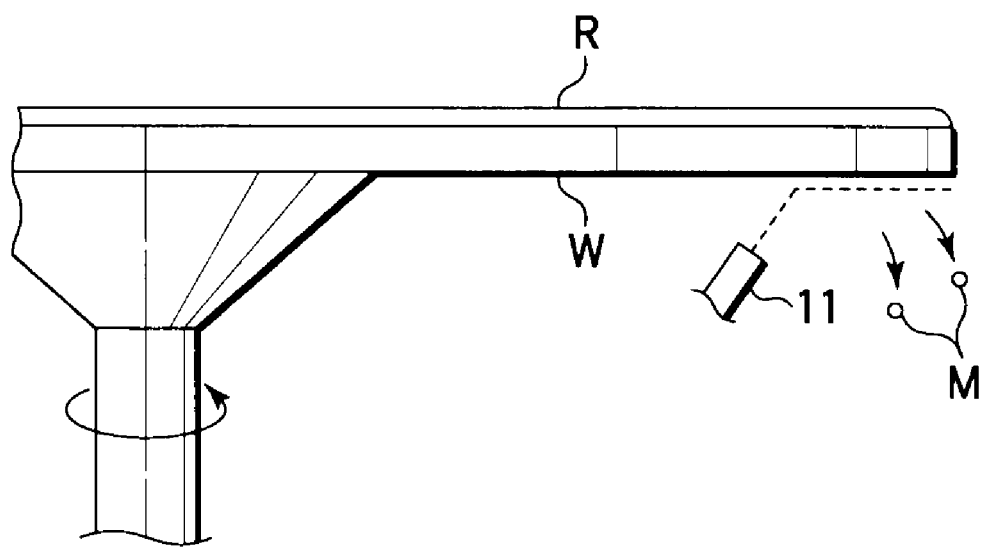

Evaluation test 3:

The number of particles deposited on a wafer W was measured in a case where the slits 41 were not formed in the partition plate 23 and in a case where the slits 41 were formed. Further, in the case where the slits 41 was not formed, comparison in the number of particles was made between a case where back side cleaning was performed by delivering a solvent from the back side cleaning nozzle 11 shown in FIGS. 24A and 24B and a case where the back side cleaning was not performed.

Where the slits 41 were not formed and the solvent was not supplied from the back side cleaning nozzle 11, 1,205 particles having a predetermined size or larger were deposited on the back side of the wafer W. This wafer is not shown. Further, where the slits 41 was not formed and the solvent was supplied from the back side cleaning nozzle 11, 93 particles P having a size of 0.15 μm or larger were deposited on the back side of the wafer W. FIG. 20A schematically shows the back side of this wafer W. FIG. 20B schematically shows the front side of the wafer W, on which 10 particles P having a size of 0.15 μm or larger were deposited. FIGS. 20C and 20D respectively shows the back side and front side of the wafer W where the slits 41 were formed, wherein 3 particles P having a size of 0.15 μm or larger were deposited on the front side and 109 particles P having a size of 0.15 μm or larger were deposited on the back side. It has been found from this result that the use of the slits 41 can decrease the number of particles as in the supply of a solvent, and thus is effective to reduce the solvent consumption. Since the embodiment described above is arranged to use the slits along with the formation of the solvent liquid film, it is estimated the particle deposition on the wafer W can be further suppressed as compared to the experimental results described above.

Figure 21A:
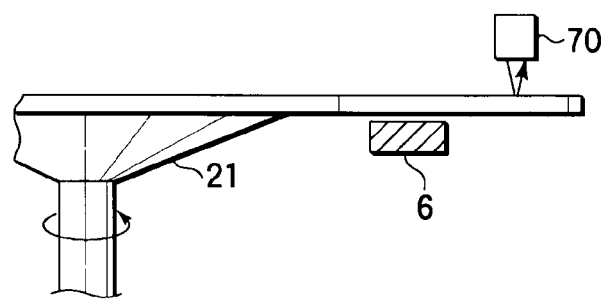
FIG. 21A is a side view showing a manner of an evaluation test.
Figure 21B:
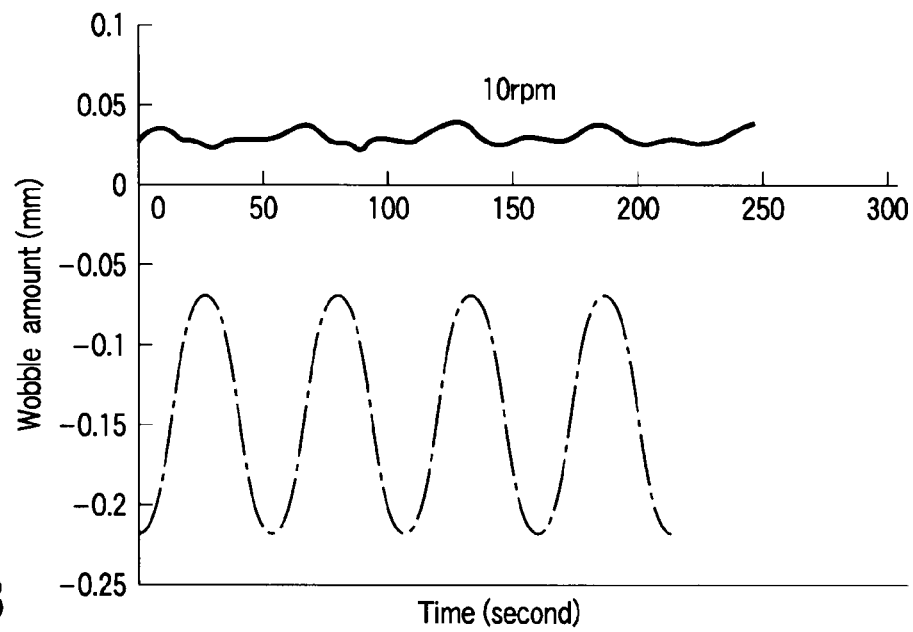
FIGS. 21B and 21C are graphs showing results of an evaluation test.
Figure 21C:
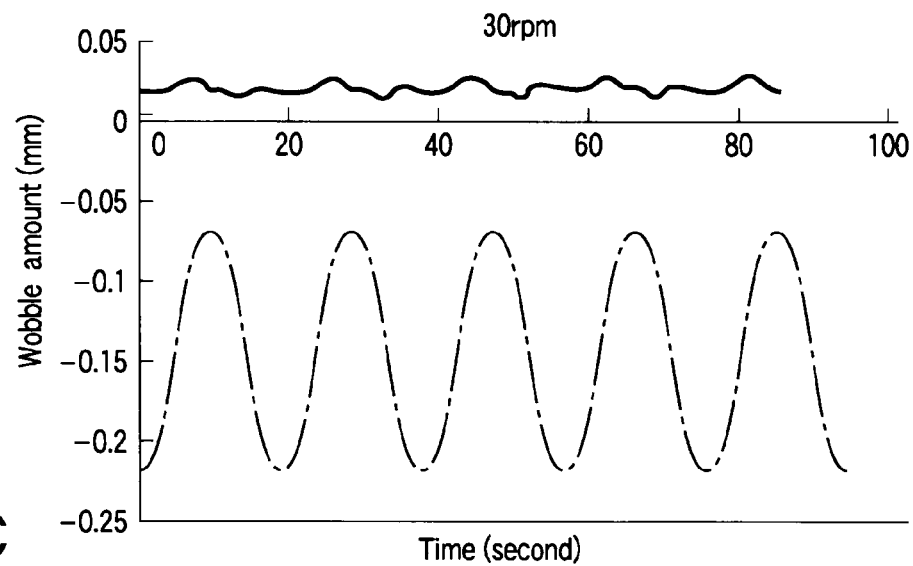
Figure 22A:
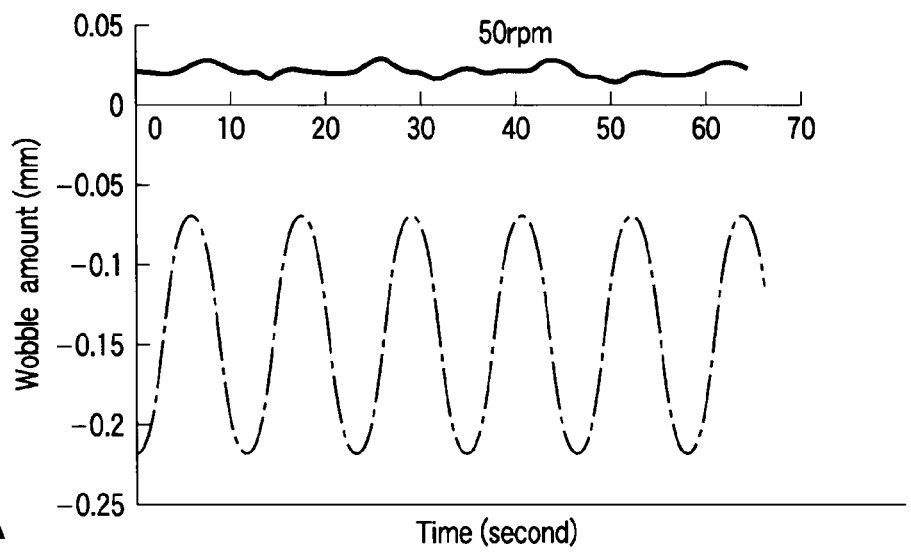
FIGS. 22A to 22C are graphs showing results of an evaluation test.
Figure 22B:
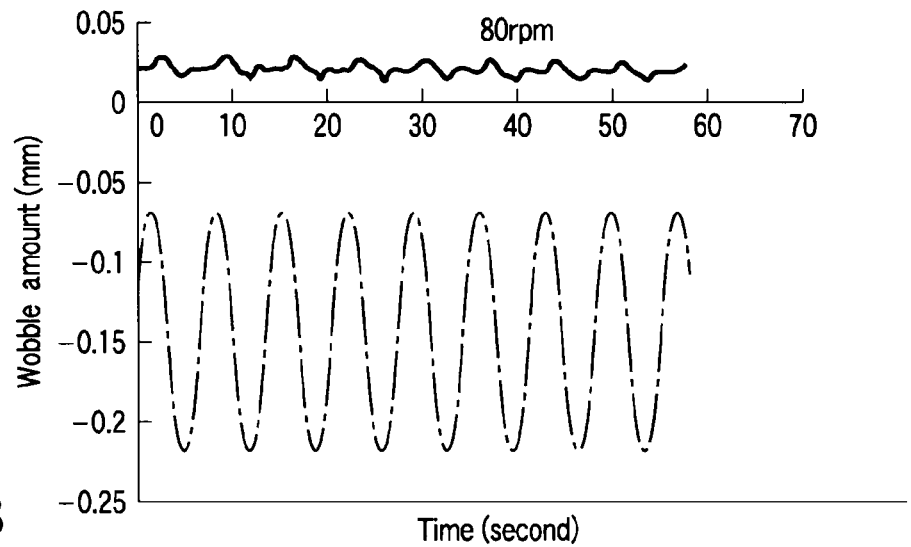
Figure 22C:
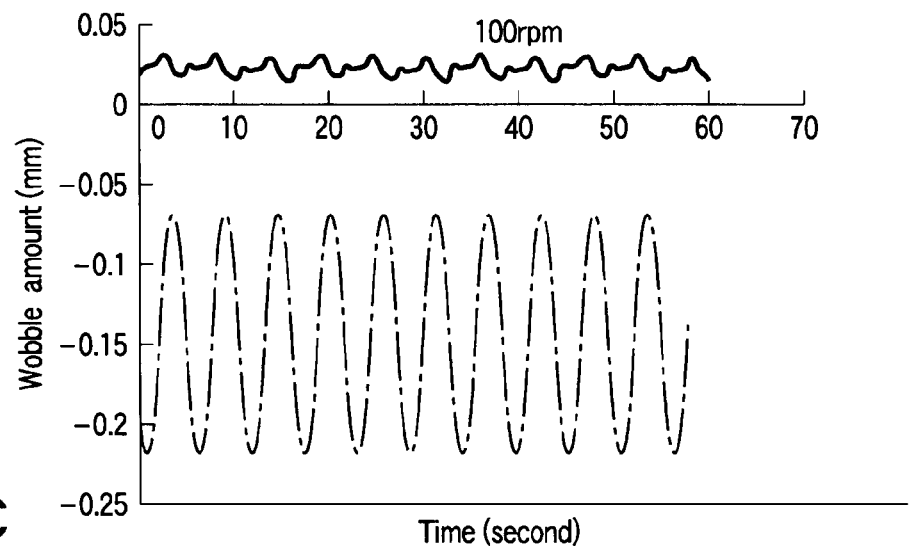

Evaluation Test 4-1:

As shown in FIG. 21A, a laser measuring device 70 was disposed to be above the peripheral portion of a wafer W, and the vertical wobble amount of the wafer W was measured while the rotational speed of the wafer was set at different values, in a case where the posture regulating was performed by the posture regulating mechanism 6 and in a case where the posture regulating was not performed. FIGS. 21B, 21C, 22A, 22B, and 23C are graphs showing the wobble amount of the wafer W where the rotational speed of the wafer W was set at 10 rpm, 30 rpm, 50 rpm, 80 rpm, and 100 rpm, respectively. In the graphs, solid lines show the vertical wobble at the measurement position with time obtained where the posture regulating was performed (after regulation), and chain lines show the vertical wobble at the measurement position with time obtained where the posture regulating was not performed (before regulation). The following table 1 shows the relationship between the rotational speed and wobble amount shown in the graphs. In each of the values of the rotational speed, the wobble amount was smaller after regulation.

TABLE 1

| | Rotational speed (rpm) | | | | |
|---|---|---|---|---|---|
| | 10 | 30 | 50 | 80 | 100 |
| Before regulation (μm) | 151 | 151 | 140 | 130 | 120 |
| After regulation (μm) | 17 | 14 | 14 | 14 | 14 |

Evaluation Test 4-2:

Further, the vertical wobble amount of a wafer W having a diameter of 300 mm was measured, at a position 20-mm distant from the edge portion (end portion) in the radial direction, by the laser measuring device 70 while the rotational speed of the wafer was set at different values, in a case where the posture regulating was performed by the posture regulating mechanism 6 and in a case where the posture regulating was not performed. The following table 2 shows results of this test.

TABLE 2

|  | Rotational speed (rpm) | | |
| --- | --- | --- | --- |
|  | 30 | 50 | 80 |
| Before regulation (μm) | 151 | 140 | 130 |
| After regulation (μm) | 14 | 14 | 14 |

It has been found from these results of the evaluation tests 4-1 and 4-2 that the use of the posture regulating mechanism 6 can damp the wobble of the wafer W. Accordingly, the posture regulating mechanism 6 allows a liquid film to be formed in the small gap between the liquid film forming mechanism and the wafer W.

Figure 23B:
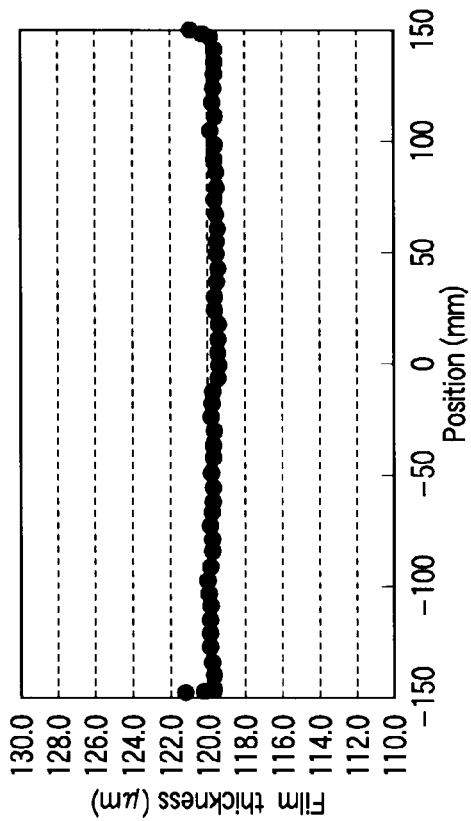
FIGS. 23A to 23D are graphs showing results of a reference test.
Figure 23D:
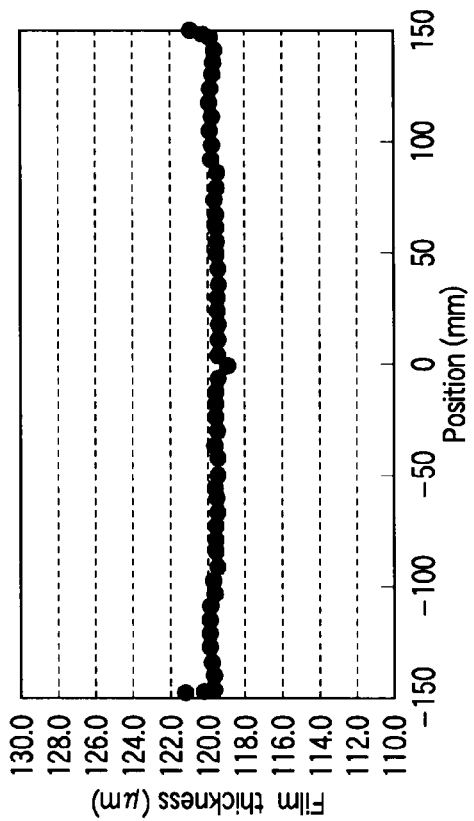
Figure 23A:
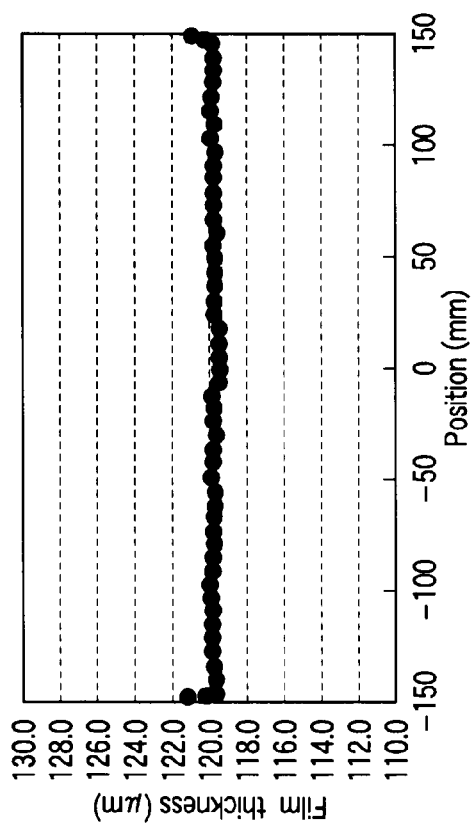
Figure 23C:
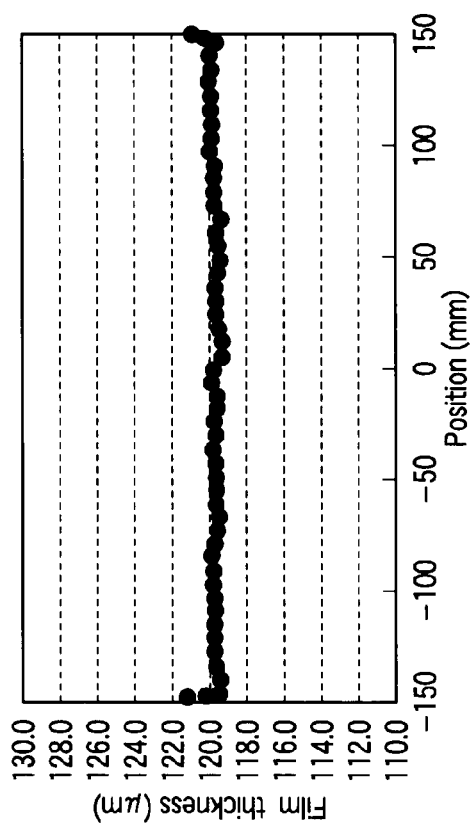

Reference Test:

The film thickness distribution of a resist film was examined in terms of a difference between a case where a solvent was supplied onto a wafer from the back side cleaning nozzle 11 and a case where the solvent was not supplied. In this experiment, resist removal on the peripheral portion of the wafer was not performed. FIGS. 23A and 23B are graphs showing the film thickness distribution obtained where the solvent was supplied. FIGS. 23C and 23D are graphs showing the film thickness distribution obtained where the solvent was not supplied. In these graphs, the horizontal axis denotes the position of the wafer W in the radial direction, wherein 0 mm is at the center of the wafer W and +150 mm and −150 mm are at opposite ends of the wafer W. The vertical axis denotes the film thickness. As shown in these graphs, there was no change observed in the film thickness distribution due to the supply of the solvent. Accordingly, it is estimated that the solvent liquid film formed in the embodiment described above does not affect the resist film thickness.

The coating apparatus according to the embodiment of the present invention described above is provided with a posture regulating mechanism configured to damp the vertical wobble of the peripheral portion of a substrate being rotated and a liquid film forming mechanism including a counter face portion facing the back side peripheral portion of the substrate. A process liquid is supplied onto the counter face portion of the liquid film forming mechanism, so that a liquid film of the process liquid is formed by its surface tension to prevent mist from being deposited on the back side peripheral portion of the substrate. Accordingly, there is no need to supply a solvent from a nozzle or the like onto the back side peripheral portion of the substrate to wash out mist, and so the solvent consumption is reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating apparatus comprising:
a substrate holding member configured to hold a back side central portion of a substrate and thereby support the substrate in a horizontal state;
a coating nozzle configured to supply a coating liquid onto a front side central portion of the substrate;
a rotational driving unit configured to rotate the substrate holding member about a vertical axis, so as to spread the coating liquid supplied on the front side central portion of the substrate toward a peripheral portion of the substrate by a centrifugal force and thereby form a film of the coating liquid;
a liquid film forming mechanism configured to form a liquid film of a process liquid for preventing a contaminant derived from the coating liquid from being deposited or left on a back side peripheral portion of the substrate, the liquid film forming mechanism including a counter face portion facing the back side peripheral portion of the substrate and a process liquid supply portion configured to supply the process liquid onto the counter face portion, so that the process liquid is adsorbed by a surface tension of the process liquid on the counter face portion and the peripheral portion of the substrate being rotated and the liquid film is thereby formed;
a posture regulating mechanism disposed around the substrate holding member and configured to damp a vertical wobble of the peripheral portion of the substrate being rotated, the posture regulating mechanism including delivery holes arrayed in a rotational direction of the substrate and configured to deliver a gas onto a back side region of the substrate on an inner side of the peripheral portion on which the liquid film is formed; and
a first elevating mechanism configured to move up and down the posture regulating mechanism between a working position for regulating a wobble of the peripheral portion of the substrate and a waiting position below the working position.

2. The coating apparatus according to claim 1, wherein the coating apparatus further comprises a control section configured to control an operation of the coating apparatus, and the control section is preset to perform control;
to rotate the substrate at a first rotational speed while supplying the coating liquid onto the substrate;
then to stop the supplying of the coating liquid and rotate the substrate at a second rotational speed lower than the first rotational speed, so as to adjust a planar distribution of the coating liquid on the substrate; and
then to rotate the substrate at a third rotational speed higher than the second rotational speed to dry the coating liquid while supplying the process liquid onto the counter face portion of the liquid film forming mechanism.

3. The coating apparatus according to claim 1, wherein the posture regulating mechanism includes suction holes arrayed in the rotational direction of the substrate and configured to apply a suction force to the back side region of the substrate on the inner side of the peripheral portion on which the liquid film is formed, so as to damp the vertical wobble of the peripheral portion of the substrate being rotated, in cooperation with the gas delivered from the delivery holes.

4. The coating apparatus according to claim 3, wherein the delivery holes and the suction holes are alternately arrayed in the rotational direction and radial directions of the substrate.

5. The coating apparatus according to claim 1, wherein the coating apparatus further comprises a second elevating mechanism configured to move up and down the liquid film forming mechanism between a liquid film forming position for forming the liquid film and a waiting position below the liquid film forming position, and the second elevating mechanism moves up the liquid film forming mechanism from the waiting position to the liquid film forming position when the gas is delivered from the delivery holes of the posture regulating mechanism, so the liquid film forming mechanism does not come into contact with the substrate.

6. The coating apparatus according to claim 1, wherein the liquid film forming mechanism is provided with a drain portion configured to remove an unnecessary part of the process liquid for forming the liquid film.

7. A coating apparatus comprising:
a substrate holding member configured to hold a back side central portion of a substrate and thereby support the substrate in a horizontal state;
a coating nozzle configured to supply a coating liquid onto a front side central portion of the substrate;
a rotational driving unit configured to rotate the substrate holding member about a vertical axis, so as to spread the coating liquid supplied on the front side central portion of the substrate toward a peripheral portion of the substrate by a centrifugal force and thereby form a film of the coating liquid;
a liquid film forming mechanism configured to form a liquid film of a process liquid for preventing a contaminant derived from the coating liquid from being deposited or left on a back side peripheral portion of the substrate, the liquid film forming mechanism including a counter face portion facing the back side peripheral portion of the substrate and a process liquid supply portion configured to supply the process liquid onto the counter face portion, so that the process liquid is adsorbed by a surface tension of the process liquid on the counter face portion and the peripheral portion of the substrate being rotated and the liquid film is thereby formed; and
a posture regulating mechanism disposed around the substrate holding member and configured to damp a vertical wobble of the peripheral portion of the substrate being rotated, the posture regulating mechanism including delivery holes arrayed in a rotational direction of the substrate and configured to deliver a gas onto a back side region of the substrate on an inner side of the peripheral portion on which the liquid film is formed, wherein
the substrate holding member and the liquid film forming mechanism are disposed in a process atmosphere space inside a cup to prevent the coating liquid from being scattered, and the rotational driving unit is disposed in a non-process atmosphere space partitioned from the process atmosphere space by a partition member,
an exhaust passage is connected to the process atmosphere space, and
a gas flow channel is formed in the partition member such that gas inside the non-process atmosphere space is caused to flow into the process atmosphere space by rotation of the substrate holding member.

8. The coating apparatus according to claim 7, wherein a flow conductivity adjuster is disposed to adjust gas flow conductivity through the gas flow channel from the non-process atmosphere space into the process atmosphere space.

9. The coating apparatus according to claim 8, wherein the flow conductivity adjuster comprises a shutter configured to open/close the gas flow channel.

10. The coating apparatus according to claim 1, wherein the liquid film forming mechanism has a ring shape extending in the rotational direction of the substrate to form the liquid film in a ring shape.

11. A coating/developing apparatus including the coating apparatus according to claim 1, the coating/developing apparatus comprising:
a carrier block configured to place therein a carrier that stores substrates;
a process block comprising the coating apparatus as a coating section configured to apply a resist onto a front side of each of the substrates taken out of the carrier, and a developing section configured to perform development on each of the substrates after light-exposure; and
an interface block configured to transfer the substrates between the process block and a light-exposure apparatus configured to perform the light-exposure on the substrates with the resist applied thereon.

12. The coating apparatus according to claim 1, wherein the coating apparatus further comprises a control section configured to control an operation of the coating apparatus and including a non-transitory computer readable storage medium containing program instructions, which, when executed, cause the control section to control the coating apparatus to conduct a coating sequence, the coating sequence including:
rotating the substrate at a first rotational speed while supplying the coating liquid onto the substrate;
then stopping the supplying of the coating liquid and rotating the substrate at a second rotational speed lower than the first rotational speed, so as to adjust a planar distribution of the coating liquid on the substrate; and
then rotating the substrate at a third rotational speed higher than the second rotational speed to dry the coating liquid while supplying the process liquid onto the counter face portion of the liquid film forming mechanism.

13. The coating apparatus according to claim 1, wherein the coating apparatus further comprises a control section configured to control an operation of the coating apparatus and including a non-transitory computer readable storage medium containing program instructions, which, when executed, cause the control section to control the coating apparatus to conduct a coating sequence, the coating sequence including:
holding the back side central portion of the substrate by the substrate holding member and thereby supporting the substrate in the horizontal state;
supplying the coating liquid onto the front side central portion of the substrate from the coating nozzle;
rotating the substrate holding member about the vertical axis by the rotational driving unit at a first rotational speed, so as to spread the coating liquid supplied on the front side central portion of the substrate toward the peripheral portion of the substrate by the centrifugal force and thereby form the film of the coating liquid;
forming the liquid film of the process liquid for preventing the contaminant derived from the coating liquid from being deposited or left on the back side peripheral portion of the substrate by the liquid film forming mechanism, while supplying the process liquid onto the counter face portion from the process liquid supply portion, so that the process liquid is adsorbed by the surface tension of the process liquid on the counter face portion and the peripheral portion of the substrate being rotated and the liquid film is thereby formed; and
damping the vertical wobble of the peripheral portion of the substrate being rotated, by the posture regulating mechanism, while delivering the gas from the delivery holes onto the back side region of the substrate on the inner side of the peripheral portion on which the liquid film is formed.

14. The coating apparatus according to claim 13, wherein the coating sequence further includes, subsequent to forming the film of the coating liquid,
   stopping the supplying of the coating liquid and rotating the substrate at a second rotational speed lower than the first rotational speed, so as to adjust a planar distribution of the coating liquid on the substrate; and
   then, rotating the substrate at a third rotational speed higher than the second rotational speed to dry the coating liquid while supplying the process liquid onto the counter face portion of the liquid film forming mechanism.

15. The coating apparatus according to claim 13, wherein the coating sequence further includes removing the process liquid for forming the liquid film by rotating the substrate.

16. The coating apparatus according to claim 15, wherein the posture regulating mechanism includes suction holes arrayed in the rotational direction of the substrate, and said damping the vertical wobble includes applying a suction force by the suction holes to the back side region of the substrate on the inner side of the peripheral portion on which the liquid film is formed, so as to damp the vertical wobble of the peripheral portion of the substrate being rotated, in cooperation with the gas delivered from the delivery holes.

17. The coating apparatus according to claim 13, wherein the coating sequence further includes moving up the posture regulating mechanism to the working position for regulating the wobble of the peripheral portion of the substrate from the waiting position below the working position, while delivering the gas from the delivery holes of the posture regulating mechanism.

18. The coating apparatus according to claim 17, wherein the coating sequence further includes moving up the posture regulating mechanism while moving up the liquid film forming mechanism to a liquid film forming position for forming the liquid film from a waiting position below the liquid film forming position.

19. The coating apparatus according to claim 13, wherein the substrate holding member and the liquid film forming mechanism are disposed in a process atmosphere space inside a cup to prevent the coating liquid from being scattered, and the rotational driving unit is disposed in a non-process atmosphere space partitioned from the process atmosphere space by a partition member, and
   the coating sequence includes:
      exhausting gas from the process atmosphere space;
      causing gas inside the non-process atmosphere space to flow into the process atmosphere space through a gas flow channel formed in the partition member by rotation of the substrate holding member; and
      adjusting gas flow conductivity through the gas flow channel from the non-process atmosphere space into the process atmosphere space.

* * * * *